(12) United States Patent
Shibazaki

(10) Patent No.: US 9,019,472 B2
(45) Date of Patent: Apr. 28, 2015

(54) EXPOSURE APPARATUS, EXPOSURE METHOD, AND DEVICE MANUFACTURING METHOD

(71) Applicant: Nikon Corporation, Tokyo (JP)

(72) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/921,502

(22) Filed: Jun. 19, 2013

(65) Prior Publication Data

US 2013/0329206 A1    Dec. 12, 2013

Related U.S. Application Data

(62) Division of application No. 12/859,983, filed on Aug. 20, 2010, now Pat. No. 8,493,547.

(60) Provisional application No. 61/236,701, filed on Aug. 25, 2009.

(51) Int. Cl.
*G03B 27/42*    (2006.01)
*G03B 27/58*    (2006.01)
*G03F 7/20*    (2006.01)

(52) U.S. Cl.
CPC ........ *G03F 7/70725* (2013.01); *G03F 7/70775* (2013.01); *G03F 7/70108* (2013.01); *G03F 7/70975* (2013.01); *G03F 7/70758* (2013.01)

(58) Field of Classification Search
CPC .................. G03F 7/70725; G03F 7/70108
USPC ............... 355/52, 53, 55, 67; 356/399–401
See application file for complete search history.

(56) References Cited

U.S. PATENT DOCUMENTS

| | | |
|---|---|---|
| 4,780,617 A | 10/1988 | Umatate et al. |
| 5,196,745 A | 3/1993 | Trumper |
| 5,448,332 A | 9/1995 | Sakakibara et al. |
| 5,610,715 A | 3/1997 | Yoshii et al. |
| 5,646,413 A | 7/1997 | Nishi |
| 5,969,441 A | 10/1999 | Loopstra et al. |
| 6,208,407 B1 | 3/2001 | Loopstra |

(Continued)

FOREIGN PATENT DOCUMENTS

| | | |
|---|---|---|
| EP | 1 826 615 A2 | 8/2007 |
| JP | 2007-329475 A | 12/2007 |

(Continued)

OTHER PUBLICATIONS

Nov. 5, 2010 International Search Report issued in International Application No. PCT/JP2010/064663.

(Continued)

*Primary Examiner* — Hung Henry Nguyen
(74) *Attorney, Agent, or Firm* — Oliff PLC

(57) ABSTRACT

An exposure apparatus is equipped with an encoder system which measures positional information of a wafer stage by irradiating a measurement beam using four heads installed on the wafer stage on a scale plate which covers the movement range of the wafer stage except for the area right under a projection optical system. Placement distances of the heads here are each set to be larger than width of the opening of the scale plates, respectively. This allows the positional information of the wafer stage to be measured, by switching and using the three heads facing the scale plate out of the four heads according to the position of the wafer stage.

7 Claims, 15 Drawing Sheets

(56) References Cited

U.S. PATENT DOCUMENTS

| | | |
|---|---|---|
| 6,590,634 B1 | 7/2003 | Nishi et al. |
| 6,611,316 B2 | 8/2003 | Sewell |
| 6,778,257 B2 | 8/2004 | Bleeker et al. |
| 6,819,425 B2 | 11/2004 | Kwan |
| 7,023,610 B2 | 4/2006 | Ohtsuki et al. |
| 7,025,498 B2 | 4/2006 | Del Puerto |
| 7,102,729 B2 | 9/2006 | Renkens et al. |
| 7,161,659 B2 | 1/2007 | Van Den Brink et al. |
| 7,253,875 B1 | 8/2007 | Luttikhuis et al. |
| 7,256,871 B2 | 8/2007 | Loopstra et al. |
| 7,289,212 B2 | 10/2007 | Kwan |
| 7,292,312 B2 | 11/2007 | Loopstra et al. |
| 7,333,174 B2 | 2/2008 | Koenen et al. |
| 7,348,574 B2 | 3/2008 | Pril et al. |
| 7,349,069 B2 | 3/2008 | Beems et al. |
| 7,362,446 B2 | 4/2008 | Van Der Pasch et al. |
| 7,405,811 B2 | 7/2008 | Beems et al. |
| 7,483,120 B2 | 1/2009 | Luttikhuis et al. |
| 7,561,280 B2 | 7/2009 | Schluchter et al. |
| 7,602,489 B2 | 10/2009 | Van Der Pasch et al. |
| 7,619,207 B2 | 11/2009 | Loopstra et al. |
| 7,636,165 B2 | 12/2009 | Klaver et al. |
| 7,710,540 B2 | 5/2010 | Loopstra et al. |
| 8,786,829 B2 * | 7/2014 | Kanaya ............................ 355/72 |
| 2003/0025890 A1 | 2/2003 | Nishinaga |
| 2005/0128461 A1 | 6/2005 | Beems et al. |
| 2005/0259234 A1 | 11/2005 | Hirukawa et al. |
| 2006/0139660 A1 | 6/2006 | Kwan |
| 2006/0227309 A1 | 10/2006 | Loopstra et al. |
| 2007/0052976 A1 | 3/2007 | Pril et al. |
| 2007/0076218 A1 | 4/2007 | Van Empel et al. |
| 2007/0127006 A1 | 6/2007 | Shibazaki |
| 2007/0195296 A1 | 8/2007 | Van Der Pasch et al. |
| 2007/0211235 A1 | 9/2007 | Shibazaki |
| 2007/0263197 A1 | 11/2007 | Luttikhuis et al. |
| 2007/0281149 A1 | 12/2007 | Martens et al. |
| 2007/0288121 A1 | 12/2007 | Shibazaki |
| 2008/0068568 A1 | 3/2008 | Ebihara et al. |
| 2008/0074681 A1 | 3/2008 | Loopstra et al. |
| 2008/0088843 A1 | 4/2008 | Shibazaki |
| 2008/0094592 A1 | 4/2008 | Shibazaki |
| 2008/0240501 A1 | 10/2008 | Van Der Wijst et al. |
| 2009/0122287 A1 | 5/2009 | Kanaya |
| 2009/0284717 A1 | 11/2009 | Kanaya |

FOREIGN PATENT DOCUMENTS

| | | |
|---|---|---|
| JP | A-2007-318119 | 12/2007 |
| JP | 2009-117842 A | 5/2009 |
| WO | WO99/49504 | 9/1999 |
| WO | WO 01/35168 A1 | 5/2001 |

OTHER PUBLICATIONS

Nov. 25, 2010 Written Opinion of the International Searching Authority issued in International Application No. PCT/JP2010/064663.

May 8, 2013 Office Action issued in European Patent Application No. 10752444.9.

Nov. 5, 2012 Office Action issued in U.S. Appl. No. 12/859,983.

Oct. 30, 2014 Search Report issued in European Patent Application No. 14178301.9.

Jan. 12, 2015 Office Action issued in European Application No. 10 752 444.9.

* cited by examiner

EXPOSURE APPARATUS, EXPOSURE METHOD, AND DEVICE MANUFACTURING METHOD

CROSS-REFERENCE TO RELATED APPLICATIONS

This is a Division of application Ser. No. 12/859,983 filed Aug. 20, 2010 (now U.S. Pat. No. 8,493,547 issued Jul. 23, 2013), which in turn is a non-provisional application, which claims the benefit of U.S. Provisional Application No. 61/236,701 filed Aug. 25, 2009. The disclosure of the prior applications is hereby incorporated by reference herein in its entirety.

BACKGROUND OF THE INVENTION

1. Field of the Invention

The present invention relates to exposure apparatuses, exposure methods, and device manufacturing methods, and more particularly to an exposure apparatus and an exposure method used in a lithography process to manufacture microdevices such as a semiconductor device, and a device manufacturing method using the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper), or a projection exposure apparatus by a step-and-scan method (a so-called scanning stepper (which is also called a scanner) is mainly used.

In these types of exposure apparatuses, with finer device patterns due to higher integration of semiconductor devices, requirements for high overlay accuracy (alignment accuracy) is increasing. Therefore, requirements for higher accuracy is increasing, also in position measurement of substrates such as a wafer or a glass plate and the like on which a pattern is formed.

As an apparatus to meet such requirements, for example, in U.S. Patent Application Publication No. 2006/0227309, an exposure apparatus is proposed which is equipped with a position measurement system using a plurality of encoder type sensors (encoder heads) installed on a substrate table. In this exposure apparatus, the encoder head irradiates a measurement beam on a scale which is placed facing a substrate table, and measures the position of the substrate table by receiving a return beam from the scale.

However, in the exposure apparatus which is equipped with the position measurement system described in U.S. Patent Application Publication No. 2006/0227309, as for the actual operation, the encoder head facing the scale has to be switched from a plurality of encoder heads according to the position of the substrate table. Furthermore, when switching the encoder head which is to be used, continuity of the position measurement results of the substrate table also has to be secured.

SUMMARY OF THE INVENTION

The present invention was made under the circumstances described above, and according to a first aspect, there is provided a first exposure apparatus which sequentially exposes an energy beam on a plurality of divided areas placed in a shape of a matrix on an object, and forms a pattern on each of the plurality of divided areas, the apparatus comprising: a movable body which holds the object and moves along a predetermined plane; a position measurement system which has a plurality of heads provided on the movable body, and of the plurality of heads, obtains a positional information of the movable body, based on measurement results of a predetermined number of heads which irradiate a measurement beam on a measurement plane that has an opening partially and is placed facing the movable body and roughly parallel to the predetermined plane, receive a return beam from the measurement plane, and measure a position of the movable body in each measurement direction; and a control system which drives the movable body based on the positional information obtained by the position measurement system, and also switches at least one of the predetermined number of heads used to compute a positional information of the movable body according to a position of the movable body to a different head, wherein of the plurality of heads, a separation distance of two heads set apart in a first direction within the predetermined plane is larger than a width of the opening in the first direction.

According to this apparatus, it becomes possible to measure the positional information of a movable body by switching and using encoder heads facing a scale from a plurality of encoder heads according to the position of the movable body.

According to a second aspect of the present invention, there is provided a second exposure apparatus which sequentially exposes an energy beam on a plurality of divided areas on an object, and forms a pattern on each of the plurality of divided areas on the object, the apparatus comprising: a movable body which holds the object and moves along a predetermined plane; a position measurement system which has a plurality of heads provided on the movable body, and of the plurality of heads, irradiates a measurement beam on a measurement plane having a measurement non-effective area in part of the measurement plane, which is placed facing the movable body and roughly parallel to the predetermined plane, receives a return beam from the measurement plane, and obtains a positional information of the movable body based on measurement results of a predetermined number of heads which measure a position of the movable body in each measurement direction; and a control system which drives the movable body based on the positional information obtained by the position measurement system, while switching a head to be used to compute the positional information of the movable body, wherein of the plurality of heads, a separation distance of two heads set apart in a predetermined direction within the predetermined plane is decided, taking into consideration a size of the measurement non-effective area in the predetermined direction.

According to this apparatus, because the separation distance between the two heads is decided adequately taking into consideration the size of a measurement non-effective area in a predetermined direction, the positional information of the movable body can be measured without switching the heads while the movable body performs a constant speed movement in a predetermined direction to form a pattern on a divided area subject to formation on the object. Accordingly, it becomes possible to form a pattern on the object with good precision.

According to a third aspect of the present invention, there is provided a third exposure apparatus which sequentially exposes an energy beam on a plurality of divided areas placed in a shape of a matrix on an object, and forms a pattern on each of the plurality of divided areas, the apparatus comprising: a movable body which holds the object and moves along a predetermined plane; a position measurement system which has a plurality of heads provided on the movable body, and of the plurality of heads, irradiates a measurement beam on a measurement plane having an opening in part of the measurement plane which is placed facing the movable body and roughly parallel to the predetermined plane, receives a return beam from the measurement plane, and obtains a positional information of the movable body based on measurement results of a predetermined number of heads which measure a position of the movable body in each measurement direction; and a control system which drives the movable body based on positional information obtained by the position measurement system, and also switches at least one of the predetermined number of heads used to compute a positional information of the movable body according to a position of the movable body to a different head, wherein after a constant speed movement on the movable body is performed in a first area where heads included in a first head group and a second head group which has at least one different head of the plurality of heads face the measurement plane, in a first direction of the predetermined plane to form the pattern in a divided area subject to formation of the plurality of divided areas based on the positional information of the movable body which is obtained based on measurement results of the first head group, heads used to compute positional information of the movable body are switched to the second head group before the movable body moves from the first area to a second area where only the heads included in the second head group face the measurement plane.

According to this apparatus, the positional information of the movable body can be measured without switching the heads while the movable body performs a constant speed movement in the first direction to form a pattern on a divided area subject to formation on the object. Accordingly, it becomes possible to form a pattern on the object with good precision.

According to a fourth aspect of the present invention, there is provided a first exposure method in which a plurality of divided areas placed in a shape of a matrix on an object is sequentially exposed an energy beam, and a pattern is formed on each of the plurality of divided areas, the method comprising: obtaining a positional information of the movable body, based on measurement results of a predetermined number of heads of the plurality of heads provided on the movable body which moves along a predetermined plane holding the object, by irradiating a measurement beam on a measurement plane having an opening in part of the measurement plane which is placed facing the movable body and roughly parallel to the predetermined plane, receiving a return beam from the measurement plane, and measuring a position of the movable body in each measurement direction; moving the movable body at a constant speed in the first direction in the predetermined plane to form the pattern in a divided area subject to formation of the plurality of divided areas, based on the positional information; and after the movable body is moved at a constant speed, switching at least one of the predetermined number of heads used to compute a positional information of the movable body according to a position of the movable body to a different head.

According to this method, the positional information of the movable body can be measured without switching the heads while the movable body performs a constant speed movement in the first direction to form a pattern on a divided area subject to formation on the object. Accordingly, it becomes possible to form a pattern on the object with good precision.

According to a fifth aspect of the present invention, there is provided a second exposure method in which a plurality of divided areas placed in a shape of a matrix on an object is sequentially exposed by an energy beam, and a pattern is formed on each of the plurality of divided areas, the method comprising: obtaining a positional information of the movable body, based on measurement results of a predetermined number of heads of the plurality of heads provided on the movable body which moves along a predetermined plane holding the object, by irradiating a measurement beam on a measurement plane having an opening in part of the measurement plane which is placed facing the movable body and roughly parallel to the predetermined plane, receiving a return beam from the measurement plane, and measuring a position of the movable body in each measurement direction; stepping and driving the movable body toward a starting point of a constant speed drive to form the pattern in a divided area subject to formation of the plurality of divided areas, based on the positional information obtained; and switching at least one of the predetermined number of heads used to compute a positional information of the movable body according to a position of the movable body to a different head before the movable body is moved at a constant speed in the first direction to form the pattern in the divided area subject to formation, after the stepping and driving.

According to this method, the positional information of the movable body can be measured without switching the heads while the movable body performs a constant speed movement in the first direction to form a pattern on a divided area subject to formation on the object.

According to a sixth aspect of the present invention, there is provided a third exposure method in which a plurality of divided areas placed in a shape of a matrix on an object is sequentially exposed by an energy beam, and a pattern is formed on each of the plurality of divided areas, the method comprising: obtaining positional information of the movable body within a first area where of a plurality of heads provided on a movable body which moves along a predetermined plane holding the object, heads included in a first head group and a second head group which has at least one head different from the first head group face a measurement plane which is provided roughly parallel to the predetermined plane, based on measurement results of the first head group, and performing a constant speed drive of the movable body in a first direction of the predetermined plane to form the pattern on a divided area subject to formation of the plurality of divided areas, based on the positional information; and switching heads to be used to compute the positional information to the second heads group after the constant speed movement, before the movable body moves from the first area to a second area where heads included only in the second group face the measurement plane.

According to this method, the positional information of the movable body can be measured without switching the heads while the movable body performs a constant speed movement in the first direction to form a pattern on a divided area subject to formation on the object. Accordingly, it becomes possible to form a pattern on the object with good precision.

According to a seventh aspect of the present invention, there is provided a fourth exposure method in which a plurality of divided areas placed in a shape of a matrix on an object is sequentially exposed by an energy beam, and a pattern is formed on each of the plurality of divided areas, the method comprising: obtaining positional information of the movable body within a first area where of a plurality of heads provided on a movable body which moves along a predetermined plane holding the object, heads included in a first head group and a second head group which has at least one head different from the first head group face a measurement plane which is provided roughly parallel to the predetermined plane, based on measurement results of the first head group, and performing a step drive of the movable body toward a starting position of the constant speed movement to form the pattern on a divided area subject to formation of the plurality of divided areas, based on the positional information; and switching heads to be used to measure the positional information to the second heads group after the step drive, before the movable body moves from the first area to the second area by being moved from the starting position in the first direction by the constant speed movement to form the pattern on a divided area subject to formation.

According to this method, the positional information of the movable body can be measured without switching the heads while the movable body performs a constant speed movement in the first direction to form a pattern on a divided area subject to formation on the object. Accordingly, it becomes possible to form a pattern on the object with good precision.

According to an eighth aspect of the present invention, there is provided a fourth exposure apparatus which sequentially exposes an energy beam on a plurality of divided areas placed in a shape of a matrix on an object, and forms a pattern on each of the plurality of divided areas, the apparatus comprising: a movable body which holds the object and moves along a predetermined plane; a position measurement system which has a plurality of heads provided on the movable body, and obtains positional information of the movable body based on measurement results of a predetermined number of heads of the plurality of heads which is obtained by irradiating a measurement beam on a measurement plane placed roughly parallel to the predetermined plane facing the movable body, receiving a return beam from the measurement plane, and measuring a position of the movable body in each measurement direction; and a control system which drives the movable body based on positional information obtained from the position measurement system, as well as switch at least one head of the predetermined number of heads used to compute the positional information of the body at the time besides when a constant speed movement of the movable body is performed in a first direction within the predetermined plane to form the pattern in the divided area subject to formation of the plurality of divided areas to another head.

According to this apparatus, while the movable body performs a constant speed movement in the first direction to form a pattern on a divided area subject to formation on the object, the head is not switched. Accordingly, it becomes possible to form a pattern on the object with good precision.

According to the ninth embodiment of the present invention, there is provided a fifth exposure method in which a plurality of divided areas placed in a shape of a matrix on an object is sequentially exposed by an energy beam, and a pattern is formed on each of the plurality of divided areas, the method comprising: obtaining a positional information of the movable body, based on measurement results of a predetermined number of heads of the plurality of heads provided on the movable body which moves along a predetermined plane holding the object, by irradiating a measurement beam on a measurement plane having an opening in part of the measurement plane which is placed facing the movable body and roughly parallel to the predetermined plane, receiving a return beam from the measurement plane, and measuring a position of the movable body in each measurement direction; switching at least one of the predetermined number of heads used to compute a positional information of the movable body according to a position of the movable body to a different head at a time besides when the movable body performs the constant speed movement in the first direction to form the pattern in the divided area subject to formation.

According to this method, while the movable body performs a constant speed movement in the first direction to form a pattern on a divided area subject to formation on the object, the head is not switched. Accordingly, it becomes possible to form a pattern on the object with good precision.

According to a tenth aspect of the present invention, there is provided a device manufacturing method, including forming a pattern on an object using any one of the first to fifth exposure methods of the present invention; and developing the object on which the pattern is formed.

BRIEF DESCRIPTION OF THE DRAWINGS

In the accompanying drawings.

DESCRIPTION OF THE EMBODIMENTS

An embodiment of the present invention will be described below, with reference to FIGS. 1 to 17B.

Figure 1:
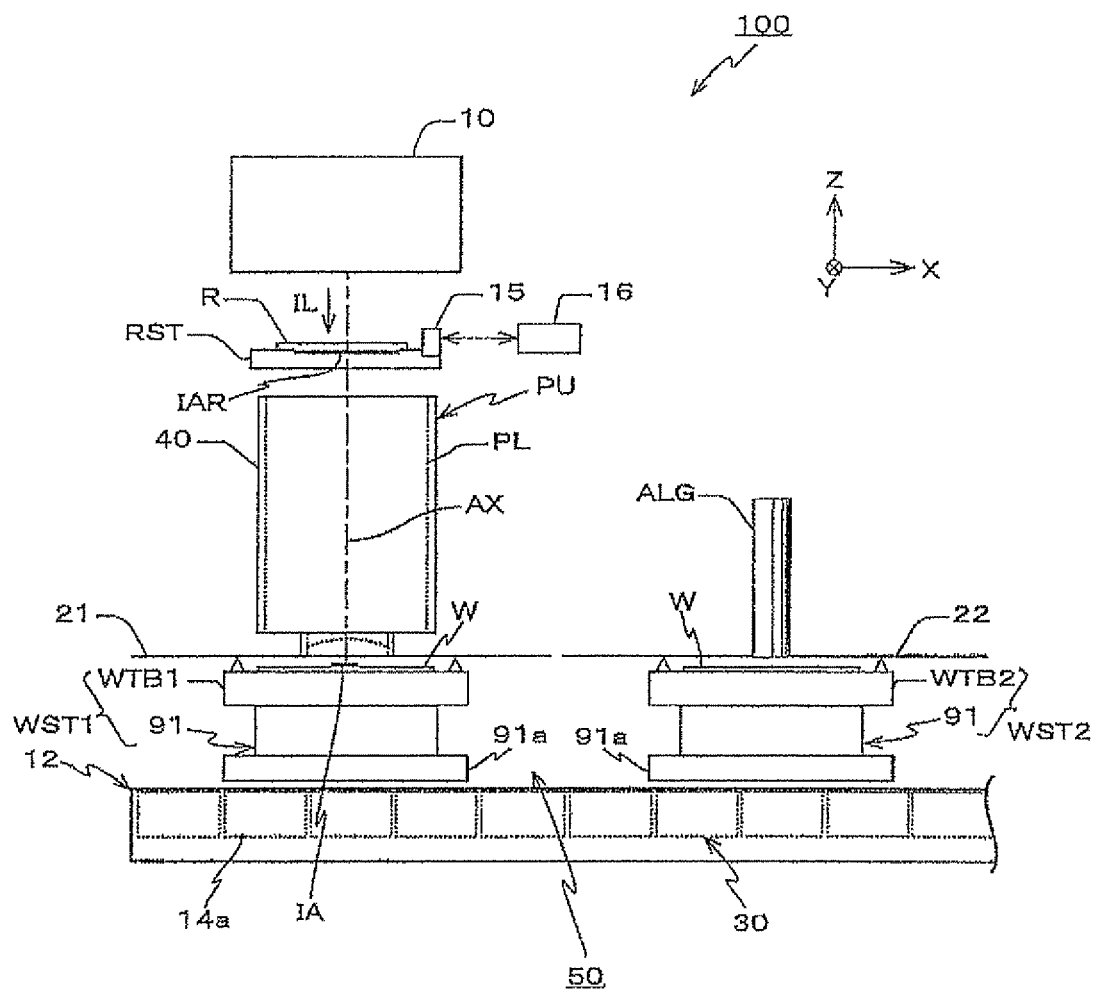
FIG. 1 is a view schematically showing the Configuration of an exposure apparatus related to an embodiment.

FIG. 1 schematically shows the configuration of an exposure apparatus 100 related to the present embodiment.

Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θ x, θ y, and θ z directions, respectively.

Exposure apparatus 100 is equipped with an illumination system 10, a reticle stage RST holding reticle R, a projection unit PU, a wafer stage device 50 including wafer stages WST1 and WST2 on which a wafer W is mounted, a control system for these parts and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR, which is set on reticle R with a reticle blind (a masking system), by an illumination light (exposure light) IL with a substantially uniform illuminance. Here, as one example, ArF excimer laser light (with a wavelength of 193 nm) is used as the illumination light IL.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 6) that includes a linear motor or the like, and reticle stage RST is also drivable in a scanning direction (in this case, the Y-axis direction, which is a direction orthogonal to the page surface in FIG. 1) at a predetermined scanning speed.

The positional information (including position information in the Pz direction (θz rotation quantity)) of reticle stage RST in the XY plane (movement plane) is constantly detected, for example, at a resolution of around 0.25 nm by a reticle laser interferometer (hereinafter referred to as a "reticle interferometer") 16, which irradiates a measurement beam on a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) shown in FIG. 1. Incidentally, to measure the positional information of reticle R at least in directions of three degrees of freedom, instead of, or together with reticle interferometer 16, the encoder system which is disclosed in, for example, U.S. Patent Application Publication No. 2007/0288121 and the like can be used.

Projection unit PU is placed below (–Z side) reticle stage RST in FIG. 1, and is held by a main frame (not shown) (metrology frame) which configures a part of a body. Projection unit PU has a barrel 40, and a projection optical system PL consisting of a plurality of optical elements held by barrel 40. As projection optical system PL, for example, a dioptric system is used, consisting of a plurality of lenses (lens elements) that has been disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, illumination light IL that has passed through reticle R which is placed so that its pattern surface substantially coincides with a first plane (an object plane) of projection optical system PL forms a reduced image of the circuit pattern (a reduced image of a part of the circuit pattern) of reticle R formed within illumination area IAR, via projection optical system PL, in an area (exposure area) IA conjugate to illumination area IAR on wafer W whose surface is coated with a resist (a sensitive agent) and is placed on a second plane (an image plane) side of projection optical system PL. And by reticle stage RST and wafer stages WST1 and WST2 being synchronously driven, reticle R is relatively moved in the scanning direction (the Y-axis direction) with respect to illumination area TAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern of reticle R is generated on wafer W according to illumination system 10 and projection optical system PL, and then by the exposure of the sensitive layer (resist layer) on wafer W with illumination light IL, the pattern is formed on wafer W.

Incidentally, the main frame can be one of a gate type frame which is conventionally used, and a hanging support type frame disclosed in, for example, U.S. Patent Application Publication No. 2008/0068568 and the like.

Figure 2:
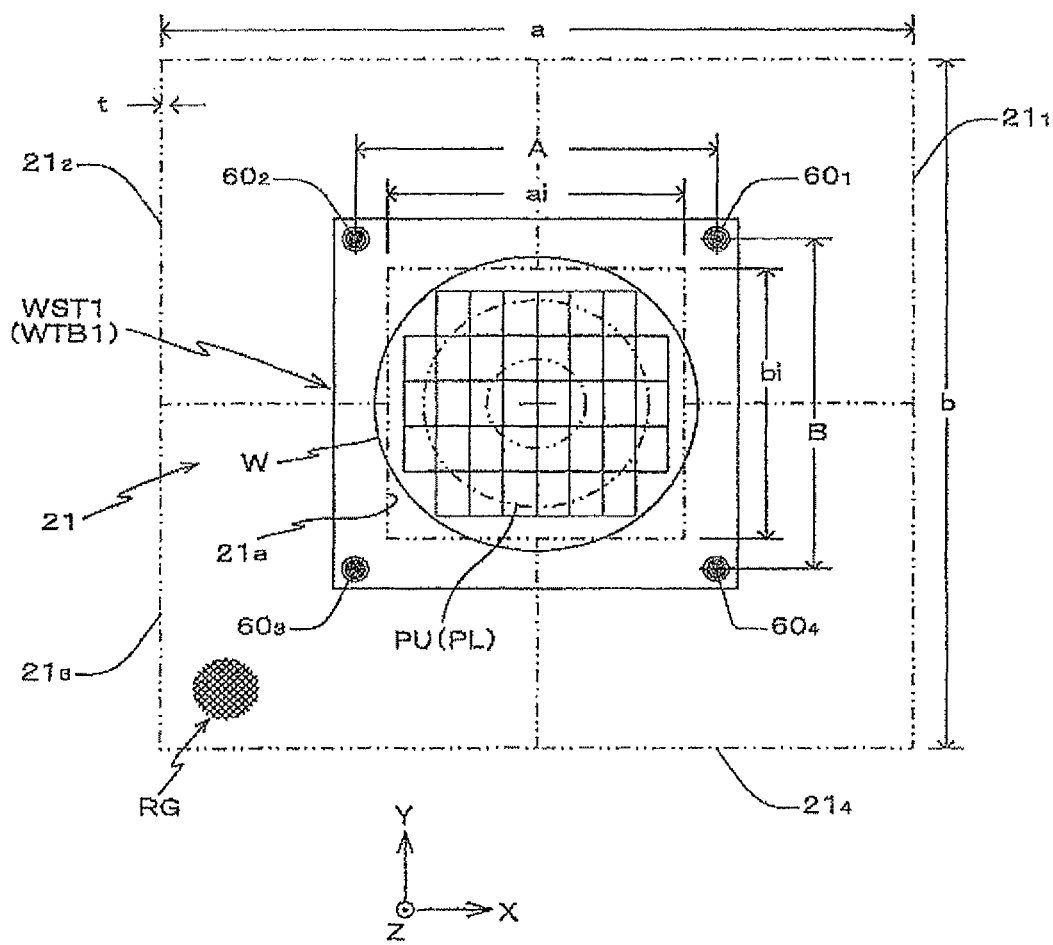
FIG. 2 is a view showing a configuration of an encoder system placed in the periphery of a projection optical system.

In the periphery on the –Z side end of barrel 40, for example, a scale plate 21 is placed parallel to the XY plane, at a height substantially flush with a surface on the lower end of barrel 40. As shown in FIG. 2 in the embodiment, scale plate 21 is configured of four L-shaped sections (parts) $21_1$, $21_2$, $21_3$, and $21_4$, and the –Z end of barrel 40 is inserted, for example, inside a rectangular shaped opening 21a formed in the center. In this case, the width in the X-axis direction and the Y-axis direction of scale plate 21 is a and b, respectively, and the width of opening 21a in the X-axis direction and the Y-axis direction is $a_i$ and $b_i$, respectively.

Figure 3:
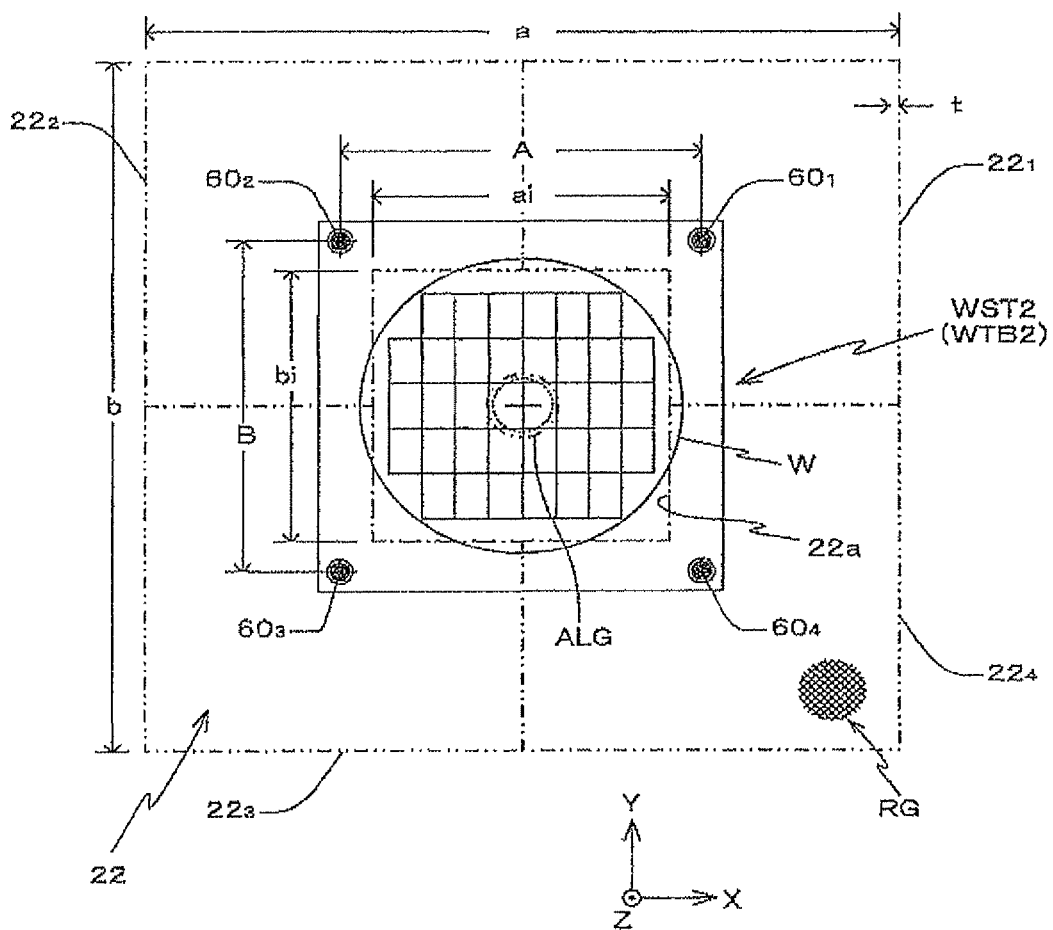
FIG. 3 is a view showing a configuration of an encoder system placed in the periphery of an alignment system.

At a position away from scale plate 21 in the +X direction is a scale plate 22, which is placed substantially flush with scale plate 21, as shown in FIG. 1. Scale plate 22 is also configured, for example, of four L-shaped sections (parts) $22_1$, $22_2$, $22_3$, and $22_4$ as is shown in FIG. 3, and the –Z end of an alignment system ALG which will be described later is inserted, for example, inside a rectangular shaped opening 22a formed in the center. The width in the X-axis direction and the Y-axis direction of scale plate 22 is a and b, respectively, and the width of opening 22a in the X-axis direction and the Y-axis direction is $a_i$ and $b_i$, respectively. Incidentally, in the embodiment, while the width of scale plates 21 and 22, and the width of openings 21a and 22a in the X-axis and the Y-axis directions were the same, the width does not necessarily have to be the same, and the width may differ in at least one of the X-axis and the Y-axis directions.

In the embodiment, scale plates 21 and 22 are supported by suspension from a main frame (not shown) (metrology frame) which supports projection unit PU and alignment system ALG. On the lower surface (a surface on the –Z side) of scale plates 21 and 22, a reflection type two-dimensional diffraction grating RG (refer to FIGS. 2, 3, and 4) is formed, consisting of a grating of a predetermined pitch, such as, for example, a grating of 1 µm whose periodic direction is in a direction of 45 degrees with the X-axis serving as a reference (a direction of –45 degrees when the Y-axis serves as a reference), and a grating of a predetermined pitch, such as, for example, a grating of 1 µm, whose periodic direction is in a direction of –45 degrees with the X-axis serving as a reference (–135 degrees when the Y-axis serves as a reference).

However, due to the configuration of the two-dimensional grating RG and an encoder head which will be described later on, a non-effective area having a width t is included in each of the vicinity of the outer periphery of sections $21_1$ to $21_4$ and $22_1$ to $22_4$ configuring scale plates 21 and 22. The two-dimensional grating RG of scale plates 21 and 22 covers a movement range of wafer stages WST1 and WST2, respectively, at least at the time of exposure operation and alignment (measurement).

Wafer stage device 50, as shown in FIG. 1, is equipped with a stage base 12 supported almost horizontally by a plurality of (for example, three or four) vibration isolation mechanisms (omitted in the drawings) on the floor surface, wafer stages WST1 and WST2 placed on stage base 12, a wafer stage drive system 27 (only a part of the system shown in FIG. 1, refer to FIG. 6) which drives wafer stages WST1 and WST2, and a measurement system which measures the position of wafer stages WST1 and WST2 and the like. The measurement system is equipped with encoder systems 70 and 71, and a wafer laser interferometer system (hereinafter simply referred to as a wafer interferometer system) 18 and the like shown in FIG. 6. Incidentally, encoder systems 70 and 71, and wafer interferometer system 18 will be further described later in the description. However, in the embodiment, wafer interferometer system 18 does not necessarily have to be provided.

As shown in FIG. 1, stage base 12 is made of a member having a tabular form, and the degree of flatness of the upper surface is extremely high and serves as a guide surface when wafer stages WST1 and WST2 move. Inside stage base 12, a coil unit is housed, including a plurality of coils 14a placed in the shape of a matrix with the XY two-dimensional direction serving as a row direction and a column direction.

Incidentally, another base member to support the base by levitation can be provided separately from stage base 12, and stage base 12 can be made to function as a counter mass (reaction force canceller) which moves according to the law of conservation of momentum by the reaction force of the drive force of wafer stages WST1 and WST2.

As shown in FIG. 1, wafer stage WST1 has a stage main section 91, and a wafer table WTB1 which is placed above stage main section 91 and is supported in a non-contact manner with respect to stage main section 91 by a Z tilt drive mechanism (not shown). In this case, wafer table WTB1 is supported in a non-contact manner by Z tilt drive mechanism by adjusting the balance of the upward force (repulsion) such as the electromagnetic force and the downward force (gravitation) including the self-weight at three points, and is also finely driven at least in directions of three degrees of freedom, which are the Z-axis direction, the θx direction, and the θy direction. At the bottom of stage main section 91, a slider section 91a is arranged. Slider section 91a has a magnet unit made up of a plurality of magnets arranged two-dimensionally within the XY plane, a housing to house the magnetic unit, and a plurality of air bearings arranged in the periphery of the bottom surface of the housing. The magnet unit configures a planar motor 30 which uses the drive of an electromagnetic force (the Lorentz force) as disclosed in, for example, U.S. Pat. No. 5,196,745, along with the coil unit previously described. Incidentally, as planar motor 30, the drive method is not limited the Lorentz force drive method, and a planar motor by a variable reluctance drive system can also be used.

Wafer stage WST1 is supported by levitation-above stage base 12 by a predetermined clearance (clearance gap/distance/gap/spatial distance), such as around several μm, by the plurality of air bearings described above, and is driven in the X-axis direction, the Y-axis direction, and the θz direction by planar motor 30. Accordingly, wafer table WTB1 (wafer W) is drivable with respect to stage base 12 in directions of six degrees of freedom (hereinafter shortly described as the X-axis direction, the Y-axis direction, the Z-axis direction, the θx direction, the θy direction, and the θz direction (hereinafter X, Y, Z, θx, θy, θz)).

In the embodiment, a main controller 20 controls the magnitude and direction of current supplied each of the coils 14a configuring the coil unit. Wafer stage drive system 27 is configured, including planar motor 30 and the Z tilt drive mechanism previously described. Incidentally, planar motor 30 is not limited to a motor using a moving magnet method, and can be a motor using a moving coil method. Further, as planar motor 30, a magnetic levitation type planar motor can be used. In this case, the air bearing previously described does not have to be arranged. Further, wafer stage WST can be driven in directions of six degrees of freedom by planar motor 30. Further, wafer table WTB1 can be made finely movable in at least one of the X-axis direction, the Y-axis direction, and the θZ direction. More specifically, wafer stage WST1 can be configured by a rough/fine movement stage.

On wafer table WTB1, wafer W is mounted via a wafer holder (not shown), and is fixed by a chuck mechanism (not shown), such as, for example, vacuum suction (or electrostatic adsorption). Although it is not shown, on one of the diagonal lines on wafer table WTB1, a first fiducial mark plate and a second fiducial mark plate are provided, with the wafer holder in between. On the upper surface of the first and second fiducial mark plates, a plurality of reference marks which are detected by a pair of reticle alignment systems 13A and 13B and alignment system ALG are formed, respectively. Incidentally, the positional relation between the plurality of reference marks on the first and second fiducial plates are to be known.

Wafer stage WST2 is also configured in a similar manner as wafer stage WST1.

Encoder systems 70 and 71 obtain (measure) positional information of wafer stages WST1 and WST2, respectively, in directions of six degrees of freedom (X, Y, Z, θx, θy, θz) in an exposure time movement area (in an area where the wafer stage moves when exposing a plurality of shot areas on wafer W) including an area right below projection optical system PL, and in an alignment time movement area including an area right below alignment system ALG. Now, a configuration and the like of encoder systems 70 and 71 will be described in detail. Incidentally, exposure time movement area (a first movement area) is an area in which the wafer stage moves during an exposure operation within the exposure station (a first area) where the exposure of the wafer is performed via projection optical system PL, and the exposure operation, for example includes not only exposure of all of the shot areas on the wafer to which the pattern should be transferred, but also the preparatory operations (for example, detection of the fiducial marks previously described) for exposure. Measurement time movement area (a second movement area) is an area in which the wafer stage moves during a measurement operation within the measurement station (a second area) where the measurement of the positional information is performed by detection of alignment marks on the wafer by alignment system ALG, and the measurement operation, for example, includes not only detection of a plurality of alignment marks on the wafer, but also detection (furthermore, measurement of positional information (step information) of the wafer in the Z-axis direction) of fiducial marks by alignment system ALG.

Figure 4:
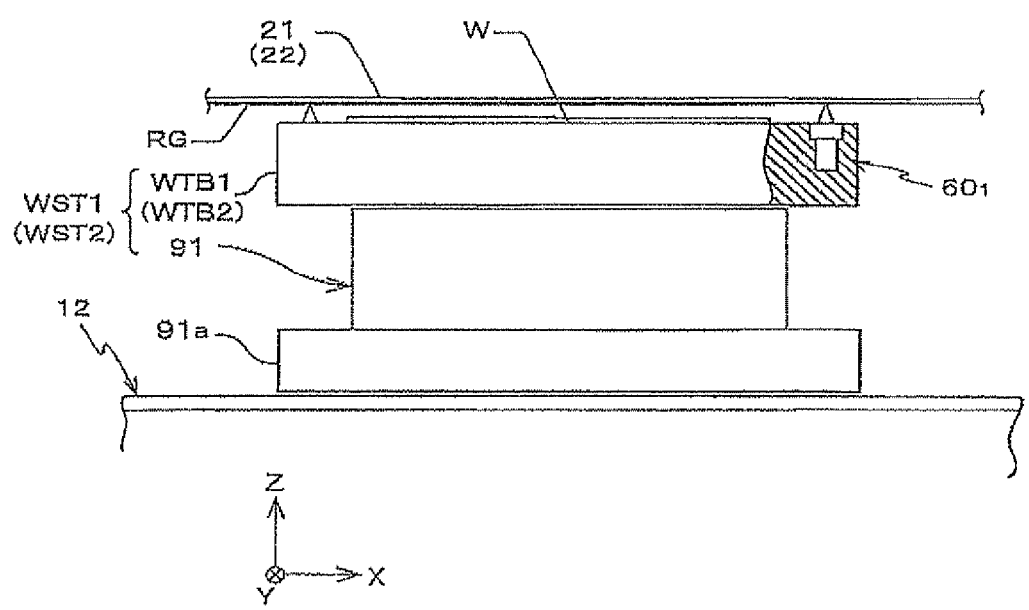
FIG. 4 is an enlarged view of a wafer stage partially fractured.

In wafer tables WTB1 and WTB2, as shown in an planar view in FIGS. 2 and 3, respectively, encoder heads (hereinafter appropriately referred to as a head) $60_1$ to $60_4$ are placed in each of the four corners on the upper surface. In this case, the separation distance in the X-axis direction between heads $60_1$ and $60_2$ and the separation distance in the X-axis direction between heads $60_3$ and $60_4$ are both equal to A. Further, the separation distance in the Y-axis direction between heads $60_1$ and $60_4$ and the separation distance in the Y-axis direction between heads $60_2$ and $60_3$ are both equal to B. These separation distances A and B are larger than width $a_t$ and $b_t$ of opening 21a of scale plate 21. Specifically, taking into consideration width t of the non-effective area previously described, A≥$a_t$+2t, B≥$b_t$+2t. Heads $60_1$ to $60_4$ are housed, respectively, inside holes of a predetermined depth in the Z-axis direction which have been formed in wafer tables WTB1 and WTB2 as shown in FIG. 4, with head $60_1$ taken up as a representative.

Figure 5:
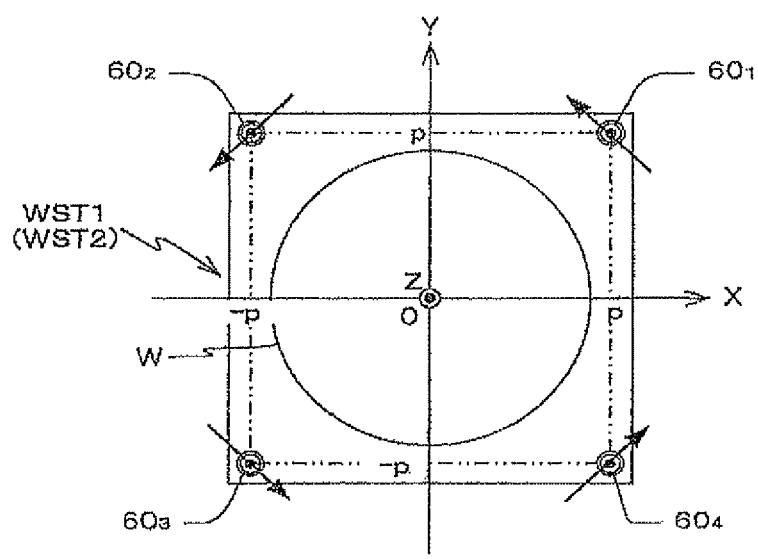
FIG. 5 is a view showing a placement of encoder heads on the wafer stage.

As shown in FIG. 5, head $60_1$ is a two-dimensional head in a −135 degrees direction with the X-axis serving as a reference (in other words, a −45 degrees direction with the X-axis serving as a reference) and whose measurement direction is in the Z-axis direction. Similarly, heads $60_2$ to $60_4$ are two-dimensional heads that are in a 225 degrees direction with the X-axis serving as a reference (in other words, a 45 degrees direction with the X-axis serving as a reference) whose measurement direction is in the Z-axis direction, a 315 degrees direction with the X-axis serving as a reference (in other words, a −45 degrees direction with the X-axis serving as a reference) whose measurement direction is in the Z-axis direction, and a 45 degrees direction with the X-axis serving as a reference whose measurement direction is in the Z-axis direction, respectively. As is obvious from FIGS. 2 and 4, heads $60_1$ to $60_4$ irradiate a measurement beam on the two dimensional diffraction grating RG formed on the surface of sections $21_1$ to $21_4$ of scale plate 21 or sections $22_1$ to $22_4$ of scale plate 22 that face the heads, respectively, and by receiving the reflected/diffraction beams from the two-dimensional grating, measure the position of wafer table WTB1 and WTB2 (wafer stages WST1 and WST2) for each of the measurement directions. Now, as each of the heads $60_1$ to $60_4$, a sensor head having a configuration similar to a sensor head for measuring variation as is disclosed in, for example, U.S. Pat. No. 7,561,280, can be used.

In heads $60_1$ to $60_4$ configured in the manner described above, since the optical path lengths of the measurement beams in air are extremely short, the influence of air fluctuation can mostly be ignored. However, in the embodiment, the light source and a photodetector are arranged external to each head, or more specifically, inside (or outside) stage main section 91, and only the optical system is arranged inside of each head. And the light source, the photodetector, and the optical system are optically connected via an optical fiber (not shown). In order to improve the positioning precision of wafer table WTB (fine movement stage), air transmission of a laser beam and the like can be performed between stage main section 91 (rough movement stage) and wafer table WTB (fine movement stage) (hereinafter shortly referred to as a rough/fine movement stage), or a configuration can be employed where a head is provided in stage main section 91 (rough movement stage) so as to measure a position of stage main section 91 (rough movement stage) using the head and to measure relative displacement of the rough/fine movement stage with another sensor.

When wafer stage WST1 and WST2 are located within the exposure time movement area previously described, head $60_1$ configures two-dimensional encoders $70_1$ and $71_1$ (refer to FIG. 6) which irradiate a measurement beam (measurement light) on (section $21_1$ of) scale plate 21, receive the diffraction beam from the grating whose periodical direction is in a 135 degrees direction, or in other words, whose periodical direction is in a −45 degrees (hereinafter simply referred to as a −45 degrees direction), with the X-axis serving as a reference formed on the surface (lower surface) of scale plate 21, and measure the position of wafer tables WTB1 and WTB2 in the −45 degrees direction and in the Z-axis direction. Similarly, heads $60_2$ to $60_4$ each configure two-dimensional encoders $70_2$ to $70_4$ and $71_2$ to $71_4$ (refer to FIG. 6) which irradiate a measurement beam (measurement light) on (sections $21_2$ to $21_4$ of) scale plate 21, respectively, receive a diffraction beam from the grating whose periodical direction is in a 225 degrees direction, or in other words, whose periodical direction is in a +45 degrees (hereinafter simply referred to as a 45 degrees direction) with the X-axis serving as a reference, a 315 degrees direction, or in other words, whose periodical direction is in a −45 degrees direction with the X-axis serving as a reference, and a 45 degrees direction, formed on the surface (lower surface) of scale plate 21, and measure the position in the 225 degrees (45 degrees) direction and in the Z-axis direction, the position in the 315 degrees (−45 degrees) direction and the Z-axis direction, and the position in the 45 degrees direction and the Z-axis direction of wafer tables WTB1 and WTS2.

Further, when wafer stage WST1 and WST2 are located within the measurement time movement area previously described, head $60_1$ configures two-dimensional encoders $70_1$ and $71_1$ (refer to FIG. 6) which irradiate a measurement beam (measurement light) on (section $22_1$ of) scale plate 22, receive the diffraction beam from the grating whose periodical direction is in a 135 degrees direction (−45 degrees direction) with the X-axis serving as a reference formed on the surface (lower surface) of scale plate 22, and measures the position of wafer tables WTB1 and WTB2 in the 135 degrees direction and in the Z-axis direction. Similarly, heads $60_2$ to $60_4$ configure two-dimensional encoders $70_2$ to $70_4$ and $71_2$ to $71_4$ (refer to FIG. 6) which irradiate a measurement beam (measurement light) on (sections $22_2$ to $22_4$ of) scale plate 22, respectively, receive a diffraction beam from the grating whose periodical direction is in a 225 degrees direction (45 degrees direction), a 315 degrees direction (−45 degrees direction), and a 45 degrees direction with the X-axis serving as a reference, formed on the surface (lower surface) of scale plate 22r and measure the position of wafer tables WTB1 and WTB2 in the 225 degrees direction (45 degrees direction) and in the Z-axis direction, the 315 degrees direction (−45 degrees direction) and the Z-axis direction, and the 45 degrees direction and the Z-axis direction.

As it can be seen from the description above, in this embodiment, regardless of irradiating the measurement beam (measurement light) either on scale plate 21 or 22, or in other words, regardless of whether wafer stages WST1 and WST2 are located in the exposure time movement area or the measurement time movement area, heads $60_1$ to $60_4$ configure two-dimensional encoder $70_1$ to $70_4$ along with the scale plates on which the measurement beam (measurement light) is irradiated, and heads $60_1$ to $60_4$ on wafer stage WST2 are to configure two-dimensional encoders $71_1$ to $71_4$, along with the scale plates on which the measurement beams (measurement lights) are irradiated.

The measurement values of each of the two-dimensional encoders (hereinafter shortly referred to as an encoder as appropriate) $70_1$ to $70_4$, and $71_1$ to $71_4$ are supplied to main controller 20 (refer to FIG. 6). Main controller 20 obtains the positional information of wafer table WTB1 and WTB2 within the exposure time movement area including the area right under projection optical system PL, based on the measurement values of at least three encoders (in other words, at least three encoders that output effective measurement values) which face the lower surface of (sections $21_1$ to $21_4$ configuring) scale plate 21 on which the two-dimensional diffraction grating RG is formed. Similarly, main controller 20 obtains the positional information of wafer table WTB1 and WTB2 within the measurement time movement area including the area right under alignment system ALG, based on the measurement values of at least three encoders (in other words, at least three encoders that output effective measurement values) which face the lower surface of (sections $22_1$ to $22_4$ configuring) scale plate 22 on which the two-dimensional diffraction grating RG is formed.

Further, in exposure apparatus 100 of the embodiment, the position of wafer stages WST1 and WST2 (wafer tables WTB1 and WTB2) can be measured with wafer interferometer system 18 (refer to FIG. 6), independently from encoder systems 70 and 71. Measurement results of wafer interferometer system 18 are used secondarily such as when correcting (calibrating) a long-term fluctuation (for example, temporal deformation of the scale) of the measurement results of encoder systems 70 and 71, or as backup at the time of output abnormality in encoder systems 70 and 71. Incidentally, details on wafer interferometer system 18 will be omitted.

Alignment system ALG is an alignment system of an off-axis method placed on the +X side of projection optical system PL away by a predetermined distance, as shown in FIG. 1. In the embodiment, as alignment system ALG, as an example, an FIA (Field Image Alignment) system is used which is a type of an alignment sensor by an image processing method that measures a mark position by illuminating a mark using a broadband (a wide band wavelength range) light such as a halogen lamp and performing image processing of the mark image. The imaging signals from alignment system ALG are supplied to main controller 20 (refer to FIG. 6), via an alignment signal processing system (not shown).

Incidentally, alignment system ALG is not limited to the FIA system, and an alignment sensor, which irradiates a coherent detection light to a mark and detects a scattered light or a diffracted light generated from the mark or makes two diffracted lights (for example, diffracted lights of the same order or diffracted lights being diffracted in the same direction), generated from the mark interfere and detects an interference light, can naturally be used alone or in combination as needed. As alignment system ALG, an alignment system having a plurality of detection areas like the one disclosed in, for example, U.S. Patent Application Publication No, 2008/0088843 can be employed.

Moreover, in exposure apparatus 100 of the embodiment, a multiple point focal point position detection system (hereinafter shortly referred to as a multipoint AF system) AF (not shown in FIG. 1, refer to FIG. 6) by the oblique incidence method having a similar configuration as the one disclosed in, for example, U.S. Pat. No. 5,448,332 and the like, is arranged at the measurement station together with alignment system ALG. At least a part of a measurement operation by the multipoint AF system AF is performed in parallel with the mark detection operation by alignment system ALG, and the positional information of the water table is also measured during the measurement operation by the encoder system previously described. Detection signals of multipoint AF system AF are supplied to main controller 20 (refer to FIG. 6) via an AF signal processing system (not shown). Main controller 20 detects positional information (step information/unevenness information) of the wafer W surface in the Z-axis direction based on the detection signals of multipoint AF system AF and the measurement information of the encoder system previously described, and in the exposure operation, performs a so-called focus leveling control of wafer W during the scanning exposure based on prior detection results and the measurement information (positional information in the Z-axis, the θx and θy directions) of the encoder system previously described. Incidentally, multipoint AF system can be arranged within the exposure station in the vicinity of projection unit PU, and at the time of exposure operation, the so-called focus leveling control of wafer W can be performed by driving the wafer table while measuring the surface position information (unevenness information) of the wafer surface.

In exposure apparatus 100, furthermore, above reticle R, a pair of reticle alignment detection systems 13A and 13B (not shown in FIG. 1, refer to FIG. 6) of a TTR (Through The Reticle) method which uses light of the exposure wavelength, as is disclosed in, for example, U.S. Pat. No. 5,646,413 and the like, is arranged. Detection signals of reticle alignment systems 13A and 13B are supplied to main controller 20 via an alignment signal processing system (not shown). Incidentally, reticle alignment can be performed using an aerial image measuring instrument (not shown) provided on wafer stage WST, instead of the reticle alignment system.

Figure 6:
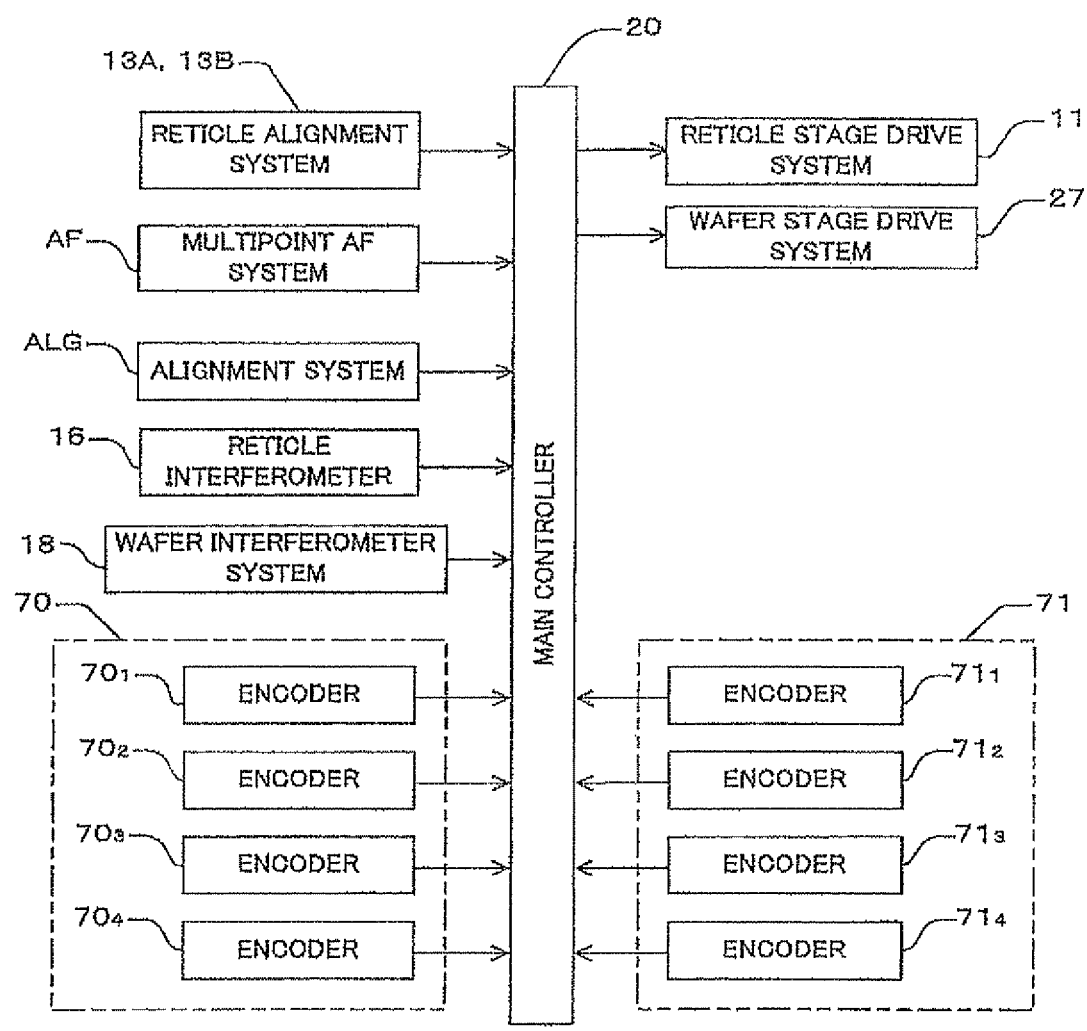
FIG. 6 is a block diagram showing the main configuration of the control system related with the stage control in the exposure apparatus in FIG. 1.

FIG. 6 is a block diagram showing a partially omitted control system related to stage control in exposure apparatus 100. This control system is mainly configured of main controller 20. Main controller 20 includes a so-called microcomputer (or workstation) consisting of a CPU (Central Processing Unit), ROM (Read Only Memory), RAM (Random Access Memory) and the like, and has overall control over the entire apparatus.

In exposure apparatus 100 configured in the manner described above, when manufacturing a device, main controller 20 moves one of wafer stages WST1 and WST2 on which the wafer is loaded within the measurement station (measurement time movement area), and the measurement operation of the wafer by alignment system ALG and multipoint AF system is performed. More specifically, in the measurement time movement area on the wafer held by one of wafer stages WST1 and WST2, mark detection using alignment system ALG, or the so-called wafer alignment (such as Enhanced Global Alignment (EGA) disclosed in, for example, U.S. Pat. No. 4,780,617 and the like) and measurement of the surface position (step/unevenness information) of the wafer using the multipoint AF system are performed. On such alignment, encoder system 70 (encoders $70_1$ to $70_4$) or encoder system 71 (encoders $71_1$ to $71_4$) obtains (measures) the positional information of wafer stages WST1 and WST2 in directions of six degrees of freedom (X, Y, Z, θx, θy, and θz).

After the measurement operation such as the wafer alignment and the like, one of the wafer stages (WST1 or WST2) is moved to exposure time movement area, and main controller 20 performs reticle alignment and the like in a procedure (a procedure disclosed in, for example, U.S. Pat. No. 5,646,413 and the like) similar to a normal scanning stepper, using reticle alignment systems 13A and 135, fiducial mark plates (not shown) on the wafer table (WTB1 or WTB2) and the like.

Then, main controller 20 performs an exposure operation by the step-and-scan method, based on the measurement results of the wafer alignment and the like, and a pattern of reticle R is transferred onto each of a plurality of shot areas on wafer W. The exposure operation by the step-and-scan method is performed by alternately repeating a scanning exposure operation where synchronous movement of reticle stage RST and wafer stage WST1 or WST2 is performed, and a movement (stepping) operation between shots where wafer stage WST1 or WST2 is moved to an acceleration starting position for exposure of the shot area. At the time of the exposure operation, encoder system 70 (encoders $70_1$ to $70_4$)

or encoder system 71 (encoders $71_1$ to $71_4$) obtains (measures) the positional information of one of the wafer stages WST1 or WST2, in directions of six degrees of freedom (X, Y, Z, θx, θy, and θz).

Further, exposure apparatus 100 of the embodiment is equipped with two wafer stages WST1 and WST2. Therefore, in parallel with performing an exposure by the step-and-scan method with respect to the wafer loaded on one of the wafer stages, such as, for example, wafer stage WST1, a parallel processing operation is performed in which wafer alignment and the like is performed on the wafer mounted on the other stage WST2.

In exposure apparatus 100 of the embodiment, as is previously described, main controller 20 obtains (measures) the positional information of wafer stage WST1 in directions of six degrees of freedom (X, Y, Z, θx, θy, and θz) using encoder system 70 (refer to FIG. 6), within both the exposure time movement area and the measurement time movement area. Further, main controller 20 obtains (measures) the positional information of wafer stage WST2 in directions of six degrees of freedom (X, Y, Z, θx, θy, and θz) using encoder system 71 (refer to FIG. 6), within both the exposure time movement area and the measurement time movement area.

Now, the principles of position measurement in directions of three degrees of freedom (also shortly referred to as the X-axis direction, the Y axis direction and the θz direction (X, Y, θ z)) within the XY plane by encoder systems 70 and 71 are further described. Here, measurement results or measurement values of encoder heads $60_a$ to $60_d$ or encoders $70_1$ to $70_4$ refer to measurement results of encoder heads $60_1$ to $60_4$ or encoders $70_1$ to $70_4$ in the measurement direction which is not in the Z-axis direction.

In the embodiment, by employing a configuration and an arrangement of encoder heads $60_1$ to $60_4$ and scale plate 21 as is previously described, at least three of the encoders head $60_1$ to $60_4$ constantly face (corresponding sections $21_1$ to $21_4$ of) scale plate 21 within the exposure time movement area.

Figure 7:
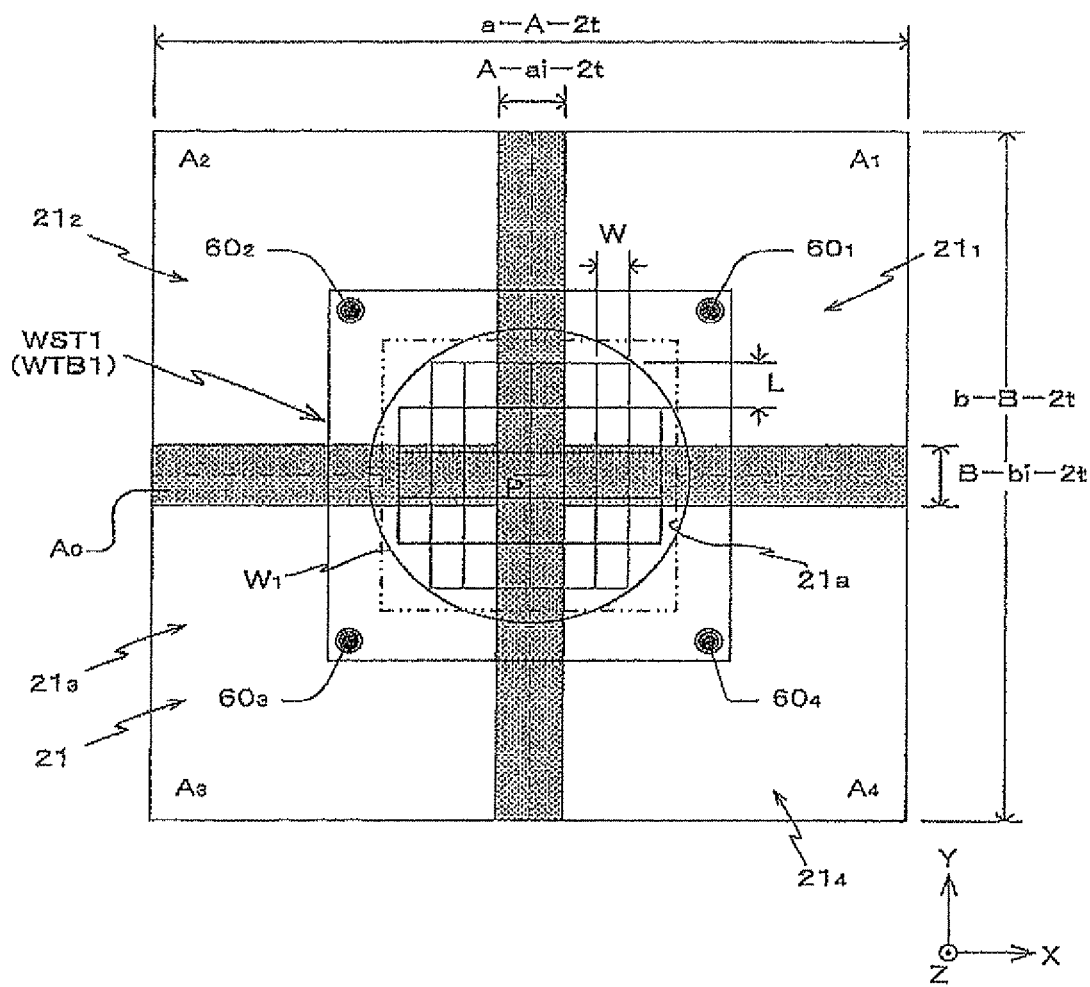
FIG. 7 is a view (No. 1) showing a relation between a placement of encoder heads and a scale plate and a measurement area of the encoder system.
Figure 8:
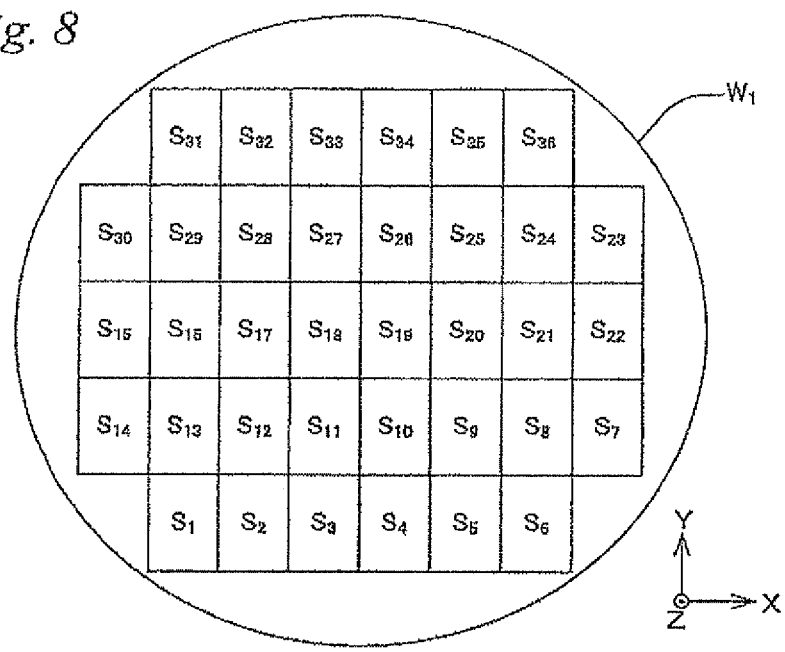
FIG. 8 is an enlarged view of wafer W1 in FIG. 7.
Figure 13:
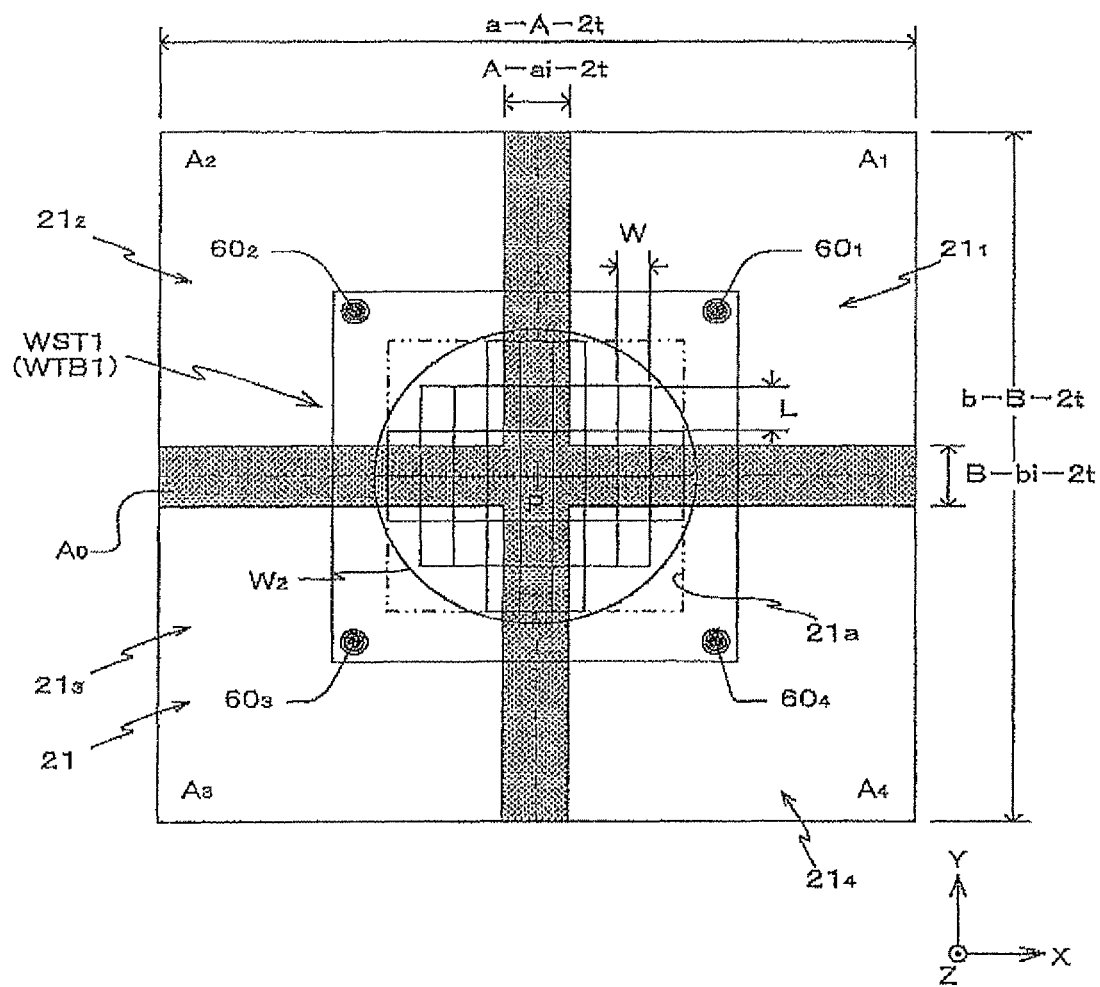
FIG. 13 is a view (No. 2) showing a relation between a placement of the encoder heads and the scale plate and the measurement area of the encoder system.
Figure 14:
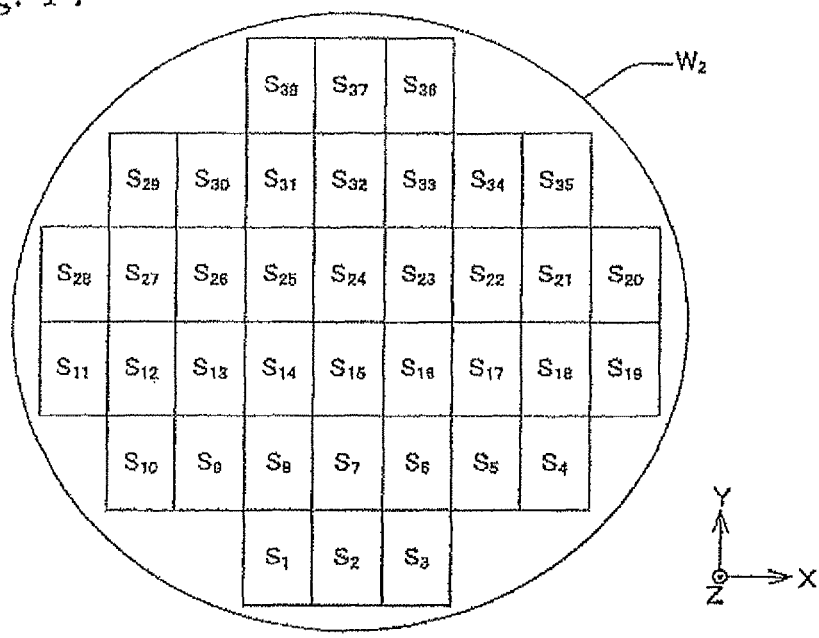
FIG. 14 is an enlarged view of wafer W2 in FIG. 13.

FIGS. 7 and 13 show a relation between a placement of encoder heads $60_1$ to $60_4$ on wafer stage WST1 and each of the sections $21_1$ to $21a$ of scale plate 21, and measurement areas $A_0$ to $A_4$ of encoder system 70. Incidentally, because the configuration of wafer stage WST2 is similar to wafer stage WST1, the description here will be made only on wafer stage WST1.

When the center (coincides with the center of the wafer) of wafer stage WST1 is located in the exposure time movement area, and within a first area $A_1$ which is an area on the +X and +Y sides with respect to exposure center (center of exposure area IA) P (an area within a first quadrant whose origin is exposure center P (except for area $A_0$)), heads $60_4$, $60_1$, and $60_2$ on wafer stage WST1 face sections $21_4$, $21_1$, and $21_2$ of scale plate 21, respectively. In the first area $A_1$, effective measurement values are sent to main controller 20 from heads $60_4$, $60_1$, and $60_2$ (encoders $70_4$, $70_1$, and $70_2$). Incidentally, the position of wafer stages WST1 and WST2 in the description below, will refer to the position in the center of the wafer stages (coincides with the center of the wafer). In other words, instead of using the description of the position in the center of wafer stages WST1 and WST2, the description the position of wafer stages WST1 and WST2 will be used.

Similarly, when wafer stage WST1 is located in the exposure time movement area, and also within a second area $A_2$, which is an area (an area (except for area $A_0$) within the second quadrant whose origin is exposure center P) on the −X side and also on the +Y side with respect to exposure center P, heads $60_1$, $60_2$, and $60_3$ face sections $21_1$, $21_2$, and $21_3$ of scale plate 21, respectively. When wafer stage WST1 is located in the exposure time movement area, and also within a third area $A_3$, which is an area (an area (except for area $A_0$) within the third quadrant whose origin is exposure center P) on the −X side and also on the −Y side with respect to exposure center P, heads $60_2$, $60_3$, and $60_4$ face sections $21_2$, $21_3$, and $21_4$ of scale plate 21, respectively. When wafer stage WST1 is located in the exposure time movement area, and also within a fourth area $A_4$, which is an area (an area (except for area $A_0$) within the fourth quadrant whose origin is exposure center P) on the +X side and also on the −Y side with respect to exposure center P, heads $60_3$, $60_4$, and $60_1$ face sections $21_3$, $21_4$, and $21_1$ of scale plate 21, respectively.

In the embodiment, as well as a condition ($A \geq a_t+2t$, $B \geq b_t+2t$) for the configuration and placement of encoder heads $60_1$ to $60_4$ and scale plate 21 previously described, condition $A \geq a_t+W+2t$, $B \geq b_t+L+2t$ is added, taking into consideration the size (W, L) of the shot area on the wafer in which the pattern is formed. In this case, W and L are the width of the shot area in the X-axis direction and the Y axis direction, respectively. W and L are equal to the distance of the scanning exposure section and the distance of stepping in the X-axis direction, respectively. Under this condition, as shown in FIGS. 7 and 13, in the case wafer stage WST1 is positioned within a cross-shaped area $A_0$ (an area whose longitudinal direction is in the Y-axis direction and has a width $A-a_t-2t$ and an area an area whose longitudinal direction is in the x-axis direction and has a width $B-b_t-2t$ that pass through exposure center P (hereinafter referred to as a zeroth area)) in which exposure position P serves as the center, all of the heads $60_1$ to $60_4$ on wafer stage WST1 face scale plate 21 (sections $21_1$ to $21_4$ corresponding to the heads). Accordingly, within the zeroth area $A_0$, effective measurement values from all of the heads $60_1$ to $60_4$ (encoders $70_1$ to $70_4$) are sent to main controller 20. Incidentally, in the embodiment, in addition to the conditions ($A \geq a_t+2t$, $B \geq b_t+2t$) described above, condition $A \geq a_t+W+2t$, $B \geq b_t+L+2t$ may be added taking into consideration the size (W, L) of the shot area on the wafer in which the pattern is formed. In this case, W and L are the width of the shot area in the X-axis direction and the Y axis direction, respectively. W and L are equal to the distance of the scanning exposure section and the distance of stepping in the X-axis direction, respectively.

Main controller 20 computes the position (X, Y, θ z) of wafer stage WST1 in the XY plane, based on measurement results of heads $60_1$ to $60_4$ (encoders $70_1$ to $70_4$). In this case, measurement values (each described as $C_1$ to $C_4$) of encoders $70_1$ to $70_4$ depend upon the position (X, Y, θz) of wafer stage WST1 as in formulas (1) to (4) below.

$$C_1 = -(\cos\theta z + \sin\theta z)X/\sqrt{2} + (\cos\theta z - \sin\theta z)Y/\sqrt{2} + \sqrt{2}p\sin\theta z \quad (1)$$

$$C_2 = -(\cos\theta z - \sin\theta z)X/\sqrt{2} - (\cos\theta z + \sin\theta z)Y/\sqrt{2} + \sqrt{2}p\sin\theta z \quad (2)$$

$$C_3 = (\cos\theta z + \sin\theta z)X/\sqrt{2} - (\cos\theta z - \sin\theta z)Y/\sqrt{2} + \sqrt{2}p\sin\theta z \quad (3)$$

$$C_4 = (\cos\theta z - \sin\theta z)X/\sqrt{2} + (\cos\theta z + \sin\theta z)Y/\sqrt{2} + \sqrt{2}p\sin\theta z \quad (4)$$

However, as shown in FIG. 5, p is the distance of the head in the X-axis and the Y-axis directions from the center of wafer table WTB1 (WTB2).

Main controller 20 specifies three heads (encoders) facing scale plate 21 according to areas $A_0$ to $A_4$ where wafer stage WST1 is positioned and forms a simultaneous equation by choosing from the formulas (1) to (4) above the formula which the measurement values of the three heads follow, and by solving the simultaneous equation using the measurement values of the three heads (encoders), computes the position (X, Y, θz) of wafer sage WST1 in the XY plane. For example, when wafer stage WST1 is located in the first area $A_1$, main controller 20 forms a simultaneous equation from formulas (1), (2) and (4) that measurement values of heads $60_1$, $60_2$, and $60_4$ (encoders $70_1$, $70_2$, and $70_4$) follow, and solves the simultaneous equation by substituting the measurement values of each of the heads into the left side of formulas (1), (2) and (4), respectively.

Incidentally, in the case wafer stage WST1 is located in the zeroth area $A_0$, main controller 20 can randomly select three heads from heads $60_1$ to $60_4$ (encoders $70_1$ to $70_4$). For example, after the first wafer stage WST1 has moved from the first area to the zeroth area, heads $60_1$, $60_2$, and $60_4$ (encoders $70_1$, $70_2$, and $70_4$) corresponding to the first area are preferably selected.

Main controller 20 drives (position control) wafer stage WST1 within the exposure time movement area, based on the computation results (X, Y, θz) above.

In the case wafer stage WST1 is located within measurement time movement area, main controller 20 measures the positional information in directions of three degrees of freedom (X, Y, θz), using encoder system 70. The measurement principle and the like, here, is the same as in the case when wafer stage WST1 is located within the measurement time movement area, except for the point where exposure center P is replaced with the detection center of alignment system ALG, and (sections $21_1$ to $21_t$ of) scale plate 21 is replaced with (sections $22_1$ to $22_4$ of) scale plate 22.

Furthermore, main controller 20 switches and uses three heads that includes at least one different head, out of heads $60_1$ to $60_4$ that face scale plates 21 and 22, according to the position of wafer stages WST1 and WST2. In this case, when switching the encoder head, a linkage process to secure the continuity of the position measurement results of the wafer stage is performed, as is disclosed in, for example, U.S. Patent Application Publication No. 2008/0094592 and the like.

Now, switching and linkage process of heads $60_1$ to $60_4$ at the time of exposure operation by the step-and-scan method will be further described.

As a first example, an exposure operation with respect to wafer $W_1$ shown in FIG. 7 will be described. In this case, on wafer $W_1$, as an example, a total of 36 shot areas $S_1$ to $S_{36}$, which are arranged in an even number in the X-axis direction and an odd number in the Y-axis direction, are to be arranged, as is shown enlarged in FIG. 8.

Figure 9:
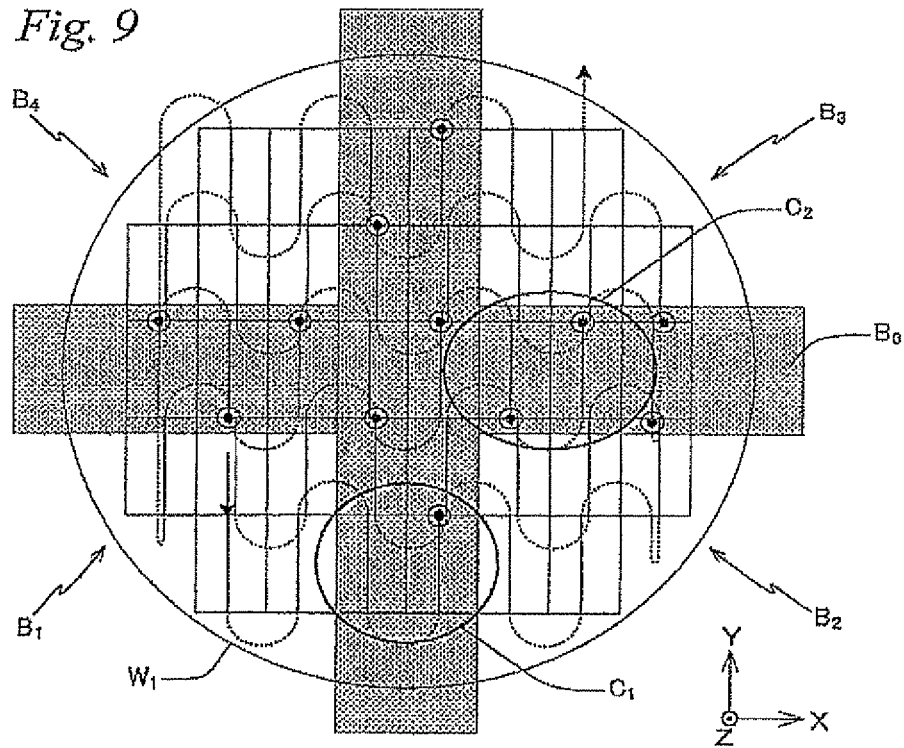
FIG. 9 is a view (No. 1) showing a movement track of an exposure center on a wafer in an exposure by a step-and-scan method.

An exposure by the step-and-scan method is performed with respect to wafer $W_1$, along a path shown in FIG. 9. Incidentally, the path in FIG. 9 shows the track of exposure center (the center of exposure area IA) P which passes over each of the shot areas. The solid line portion of this track shows a movement track of exposure center P on scanning exposure of each of the shots, and the dotted line portion (broken line portion) shows a step movement track of exposure center P between adjacent shot areas in the scanning direction and in a direction besides the scanning direction. Incidentally, although in actual, exposure center P is fixed and the wafer moves in a direction opposite to the path shown in FIG. 9, for the sake of convenience, the exposure center is to move with respect to a fixed wafer in the description.

In exposure apparatus 100 of the embodiment, three heads of heads $60_1$ to $60_4$ opposing scale plate 21 are switched and used, in response to the position of wafer stage WST1. Accordingly, when wafer stage WST1 moves from one of the areas $A_1$ to $A_4$ shown in FIG. 7 to another area via area $A_0$, the head which is to be used is switched. Therefore, in FIG. 9, overlaying the track of exposure center P on wafer $W_1$, areas $B_0$ to $B_4$ are shown which correspond to the set of heads opposing scale plate 21 when wafer stage WST1 is located at the position in the track of exposure center P.

Areas $B_0$ to $B_4$ in FIG. 9 correspond to movement areas $A_0$ to $A_4$ of wafer stage WST1 in FIG. 7, respectively. For example, when performing scanning exposure of the shot areas within area $B_i$, or when performing a step movement to the next shot area, wafer stage WST1 moves within area $A_i$. Accordingly, when exposure center P is located in area $B_1$, heads $60_4$, $60_1$, and $60_2$ face scale plate 21. Similarly, when exposure center P is located in areas $B_2$, $B_3$, $B_4$, and $B_0$, heads $60_1$, $60_2$, and $60_3$, heads $60_2$, $60_3$, and $60_4$, heads $60_3$, $60_4$, and $60_1$, and all of the heads $60_1$ to $60_4$ face scale plate 21, respectively.

Accordingly, exposure center P moves over the track shown n FIG. 9 by the scanning exposure of the shot area or the step movement between shot areas, and the head which is to be used is switched when exposure center P moves from one of the areas $B_1$ to $B_4$ to another area via area $B_0$. Therefore, in FIG. 9, occurrence places of the switching of the heads with respect to wafer W are shown by a double circle.

For example, first of all, after exposure center P performs exposure processing on the first shot area $S_1$ to the third shot area $S_3$ and has moved from area $B_1$ to area $B_0$, switching of the head (a first switching) occurs when exposure processing of the fourth shot area $S_4$ within area $B_0$ shown inside circle $C_1$ is performed and exposure center P is stepped to the fifth shot area $S_5$ within area $B_2$. Now, as is previously described, when exposure center P is located in areas $B_1$, $B_0$, and $B_2$, heads $60_0$, $60_1$, and $60_2$, all of the heads $60_1$ to $60_4$, heads $60_4$, $60_2$, and $60_3$ face scale plate 21, respectively. Accordingly, in the first switching, the heads to be used are switched from heads $60_4$, $60_1$, and $60_2$ to heads $60_1$, $60_2$, and $60_3$.

Figure 10A:
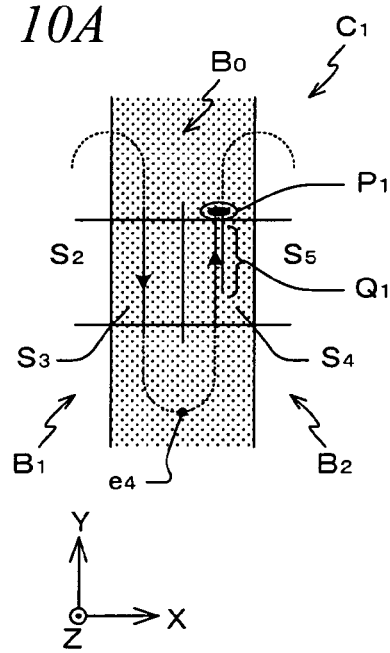
FIG. 10A is a view (No. 1) showing an example of a switching procedure of encoder heads.
Figure 10B:
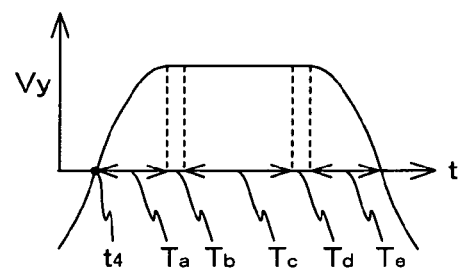
FIG. 10B is a view showing a temporal change of the drive speed of the wafer stage before and after the switching.

FIG. 10A shows an enlarged view of the inside of circle $C_1$ in FIG. 9 used to explain the details of the first switching, and FIG. 10B shows a temporal change of velocity Vy in the Y-axis direction of wafer stage WST1 after the first switching.

After the exposure processing of the third shot area $S_3$ has been performed, main controller 20 drives (position control) wafer stage WST1 based on measurement results of heads $60_4$, $60_1$, and $60_2$ (encoders $70_4$, $70_1$, and $70_2$), so that exposure center P is moved to an acceleration starting position $e_4$ to expose the fourth shot area $S_4$. When exposure center P reaches acceleration starting position $e_1$, main controller 20 starts a synchronous movement of wafer stage WST1 (wafer $W_1$) and reticle stage RST (reticle R). In other words, main controller 20 accelerates and drives wafer stage WST1, and concurrently drives reticle stage RST which follows the movement of wafer stage WST1, in a direction opposite to wafer stage WST1 also at a velocity which is a multiple of the inverse number of projection magnification P of the velocity of wafer stage WST1. As shown in FIG. 10B, the velocity of both stages WST1 and WST2 becomes constant, after an acceleration time $T_a$ has passed from the beginning of acceleration (time $t_4$).

After the acceleration has been completed, for a settling time $T_b$ until the beginning of exposure, main controller 20 drives reticle stage RST so that reticle stage RST follows wafer stage WST1 until a displacement error between wafer $W_1$ and reticle R becomes a predetermined relation (approximately zero).

After settling time $T_b$, main controller 20 drives wafer stage WST1 in a constant manner, based on measurement results of heads $60_4$, $60_1$, and $60_2$ (encoders $70_4$, $70_1$, and $70_2$). This allows exposure area IA (exposure center P) to move at a constant velocity from the −Y edge to the +Y edge of shot area S4 as is shown in FIG. 10A during exposure time $T_c$, and scanning exposure of shot area $S_4$ is performed. During the scanning exposure, the synchronous movement state at a constant velocity of wafer $W_1$ and reticle R is maintained.

After the exposure has been completed, wafer stage WST1 moves in a constant velocity during a uniform velocity overscan time (postsettling time) $T_d$. During this movement, as is shown in FIG. 10A, exposure center P passes through the first switching position $P_1$ on the +Y side of shot area $S_4$ at a constant velocity. At this point, main controller 20 switches the heads to be used from heads $60_4$, $60_1$, and $60_2$ (encoders $70_4$, $70_1$ and $70_2$) to heads $60_1$, $60_2$, and $60_3$ (encoders $70_1$, $70_2$, and $70_3$). Now, main controller 20 performs a linkage process in order to secure the continuity of measurement results of the position of wafer stage WST1 before and after the switching. In other words, main controller 20 resets measurement values $C_3$ of head $60_3$ which is to be newly used after the switching, so that measurement results (X', Y', Br') of the position of wafer stage WST1 obtained from measurement values of heads $60_1$, $60_2$, and $60_3$ coincide with measurement results (x, Y, θz) of wafer stage WST1 obtained from measurement values of heads $60_4$, $60_1$, and $60_2$. Details of this linkage process will be describer further in the description.

After the switching, main controller 20, decelerates and drives wafer stage WST1, based on the measurement results of heads $60_1$, $60_2$, and $60_3$ (encoders $70_1$, $70_2$, and $70_3$) during a deceleration overscan time $T_e$. At the same time, reticle stage RST is also decelerated. Incidentally, in the deceleration overscan time $T_e$, wafer stage WST1 is moved in the X-axis direction as well, in parallel with being moved in the Y-axis direction. This makes exposure center P draw a U-shaped track from the +Y edge of shot area $S_4$ and perform a step movement toward the next shot area within area $B_2$.

After the deceleration of wafer stage WST1 has been completed, main controller 20 continues to drive wafer stage WST1 and reticle stage RST as is previously described, however, in opposite directions, and exposes the next shot area $S_5$.

The measurement results of encoder system 70 (71) include a measurement error caused by a production error of the scale and the like.

Now, in the following description, the four heads will be abstractly described as Enc1, Enc2, Enc3, and Enc4 so as to describe the principle of the switching of the heads and the linkage process.

Figure 11A:
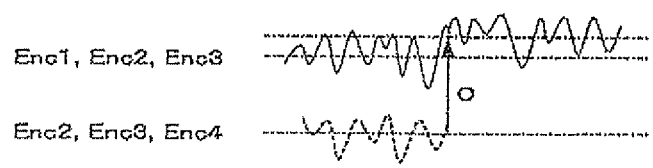
FIGS. 11A and 11B are views used to explain a linkage computing and a linkage process.

FIG. 11A shows the (track of) a temporal change of a position coordinate (X, Y, θz) of wafer stage WST1 computed from the measurement values of encoders Enc1, Enc2, and Enc3, and a position coordinate (X', Y', θz') of wafer stage WST1 computed from the measurement values of encoders Enc2, Enc3, and Enc4, before and after the switching of heads from Enc1, Enc2, and Enc3 to Enc2, Enc3, and Enc4. The track of the measurement results of the position of wafer stage WST1 fluctuates minutely by measurement errors due to the production error of the scale and the like. Therefore, in a simple linkage process like the one disclosed in U.S. Patent Application Publication No. 2008/0094592 and the like, measurement values of encoder Enc4 (in this case, measurement value $C_4$ of head $60_4$) which is to be newly used will be reset taking in the measurement errors as well. In the embodiment, a linkage process which prevents such a situation from occurring is employed.

Next, a principle of a linkage process performed in exposure apparatus 100 of the embodiment will be described. In the embodiment, main controller 20 controls the position coordinates of wafer stage WST1 by an interval of, for example, 96μ sec. At each control sampling interval, a position servo control system (part of main controller 20) updates the current position of wafer stage WST1, computes thrust command values and the like to position the stage to a target position, and outputs the results to wafer stage drive system 27. As is previously described, the current position of wafer stage WST1 is computed using three measurement values of heads $60_1$ to $60_4$ (encoders $70_1$ to $70_4$) which configure encoder system 70. The measurement values of these heads (encoders) are monitored at a time interval (measurement sampling interval) much shorter than the control sampling interval.

Figure 12:
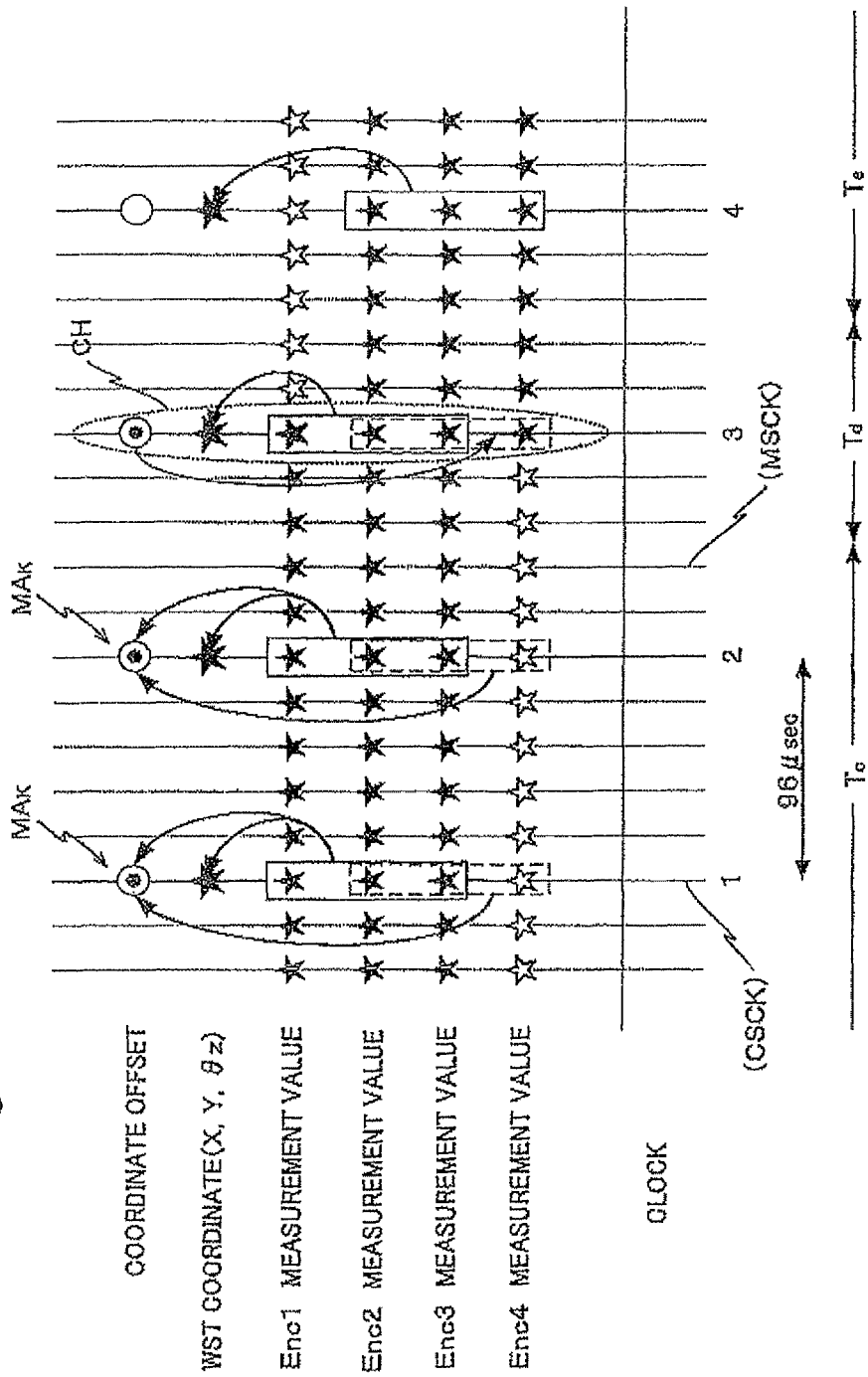
FIG. 12 is a view showing a rough configuration of a linkage process at the time when switching the encoder-heads.

FIG. 12 shows an outline of a drive (position control) of wafer stage WST, switching of heads $60_1$ to $60_4$ (encoders $70_1$ to $70_4$), and a linkage process which comes with the switching, based on the measurement results of encoder system 70. Reference code CSCK in FIG. 12 indicates the generation timing of a sampling clock (a control clock) of the position control of wafer stage WST1, and reference code MSCK indicates a generation timing of a sampling clock (a measurement clock) of the measurement of the encoder.

Main controller 20 monitors the measurement values of (the four encoders Enc1, Enc2, Enc3, and Enc4 which configure) encoder system 70 for each control clock (CSCK).

At the time of the first switching, encoders Enc1, Enc2, Enc3, and Enc4 correspond to heads $60_4$, $60_1$, $60_2$, and $60_3$ (encoders $70_4$, $70_1$, $70_2$, and $70_3$), respectively.

At the time of the control clock, main controller 20 computes a position coordinate (X, Y, θz) of wafer stage WST1 using a simultaneous equation consisting of formulas (1) to (3) which correspond to the measurement values of encoders Enc1, Enc2, and Enc3 like the time of the first control clock, as well as compute a position coordinate (X', Y', θz') of wafer stage WST1 using the measurement values of encoders Enc2, Enc3, and Enc4 which are to be used after the switching.

Main controller 20 outputs a stage position coordinate (X, Y, θz) computed from the measurement values of encoders Enc1, Enc2, and Enc3 to wafer stage drive system 27 as a stage coordinate system for servo control and drives wafer stage WST1, until the scanning exposure (exposure time Tc) of shot area $S_4$ has been completed. After the exposure has been completed, main controller 20 switches from encoders Enc1, Enc2, and Enc3 to encoders Enc2, Enc3, and Enc4, at the time of the third control clock during uniform velocity overscan time (postsettling time) Td.

As shown in FIG. 11A, the continuity of the stage position coordinate is not satisfied in the simple linkage process, due to the measurement errors caused by the production error of the scale and the like. Therefore, in parallel with the scanning exposure to shot area $S_4$, or in other words, driving wafer stage WST1 in a constant manner for a part Q1 of the scanning exposure section shown in FIG. 10A, main controller 20 performs a preprocessing (also referred to as a linkage computing) for each control clock (CSCK). In other words, main controller 20 obtains a difference between position coordinate (X, Y, θz) and position coordinate (X', Y', θz') as shown in FIG. 12, and furthermore obtains a moving average $MA_K$ {(X, Y, θz)−(X', Y', θz')} of the difference for a predetermined clock number K, which is held as a coordinate offset O. In FIG. 12, the calculation of the moving average is indicated by reference code $MA_K$.

Incidentally, moving average $MA_K$(X, Y, θz) and $MA_K$(X', Y', θz') can be obtained for a predetermined clock number K with respect to position coordinate (X, X, θz) and the position coordinate (X', Y', θz'), respectively, and a difference $MA_K$(X, Y, θz)−$MA_K$(X', Y', θz') can be held as coordinate offset O.

Main controller 20 performs a linkage process in the case of switching. In other words, main controller 20 adds the coordinate offset O held at the time of the second control clock just before to position coordinate (X', Y', θz') of wafer stage WST1 computed from the measurement values of encoders Enc2, Enc3, and Enc4 at the time of the third control clock, so that the position coordinate coincides with a position coordinate (X, Y, θ z) of wafer stage WST1 computed by the measurement values of encoders Enc1, Enc2, and Enc3 at the time of the control clock just before (in this case, the time of the second control clock). The position coordinate {(X', Y', θz')+O} to which offset cancellation has been applied is substituted in one of the formulas (1) to (4) that the measurement values of encoder Enc4 follow, so as to compute the measurement values of encoder Enc4, which are set as the measurement values of Enc4. FIG. 12 shows this linkage process as code CH.

When the linkage process above is performed, it should be confirmed that the value of coordinate offset O is sufficiently stable for the most recent predetermined clock number. Furthermore, as is previously described, position coordinate (X, Y, θ z) of wafer stage WST1 computed from the measurement values of encoder system 70 fluctuates minutely with respect to the true position by measurement errors due to the production error of the scale and the like. Therefore, the linkage process should be performed at a timing (at the time of clock generation) where the difference between position coordinate (X, Y, θz) of wafer stage WST1 computed from the measurement values of encoders Enc1, Enc2, and Enc3 and position coordinate (X', Y', θz') of wafer stage WST1 computed from the measurement values of encoders Enc2, Enc3, and Enc4 coincides or almost coincides with coordinate offset O which is sufficiently stable.

Figure 11B:
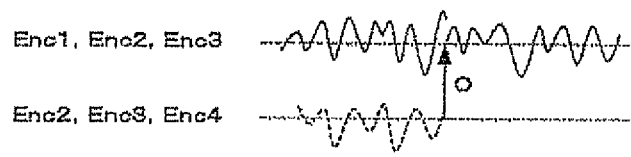

By the linkage process described so far, the continuity of the position coordinate of the wafer stage computed before and after the switching is secured, as shown in FIG. 11B.

Incidentally, the linkage process is not limited to the case of correcting the measurement values of the heads after switching as described above, and such other process can also be employed. For example, other methods can also be applied, such as driving (performing position control of) the wafer stage while adding an offset to the current position or the target position of the wafer stage with the measurement errors serving as an offset, or correcting the reticle position only by the measurement error.

After the time of the fourth control clock in FIG. 12 after the switching, main controller 20 outputs position coordinate (X', Y', θz') computed from the measurement values of encoders Enc2, Enc3, and Enc4 to wafer stage drive system 27 as a stage coordinate for servo control, and drives and controls wafer stage WST1.

Figure 10C:
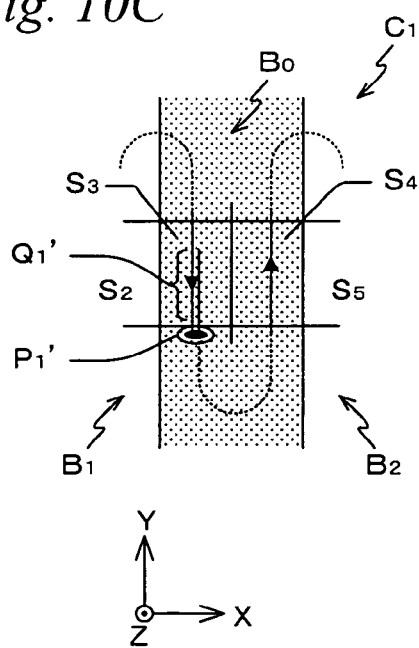
FIGS. 10C and 10D are views (No. 2 and 3) showing an example of a switching procedure of encoder heads.

Incidentally, in the first switching described above, the head to be used was switched after scanning exposure of the fourth area $S_4$ within area $B_0$ was performed, before the step movement to the fifth shot area $S_5$ within area $B_2$ is performed. Now, in the arrangement of the shot area on wafer $W_1$ shown in FIG. 7, the third shot area $S_3$ is also included in area $B_0$ as shown in FIG. 9. Therefore, as shown in FIG. 10C, the head to be used can be switched after scanning exposure of the third area $S_3$ within area $B_0$ has been performed, before the step movement to the fourth shot area $S_4$ is performed. In this case, after the scanning exposure of the third shot area $S_3$ has been performed driving wafer stage WST1 in a constant manner for a part of the scanning exposure section $Q1'$ with respect to shot area $S_3$, concurrently with the linkage computing described above being performed, the heads to be used are switched from heads $60_4$, $60_1$, and $60_2$ to heads $60_1$, $60_2$, and $60_3$ when wafer stage WST1 passes through a switching occurrence position $P_1'$ on the −Y side of the third shot area $S_3$ at a constant speed. In such case, main controller 20 resets measurement value $C_3$ of head $60_3$ which is to be newly used after the linkage process, or in other words, after the switching, using coordinate offset O which is obtained by the linkage computing, so that the continuity of the measurement results of the position of wafer stage WST1 before and after the switching is secured.

Similar to the first switching described above, after exposure center P performs exposure processing on the seventh shot area $S_7$ to the tenth shot area $S_{10}$ and has moved from area $B_2$ to area $B_0$, switching of the head (a second switching) occurs when exposure processing of the eleventh shot area $S_{11}$ within area $B_0$ is performed and exposure center P is stepped to the twelfth shot area $S_{12}$ within area $B_1$. In this case, the heads to be used are switched from heads $60_1$, $60_2$, and $60_3$ to heads $60_4$, $60_1$, and $60_2$.

Next, when a step-and-scan exposure is performed of the $15^{th}$ shot area $S_{15}$ to the $22^{nd}$ shot area $S_{22}$ lined in the X-axis direction in the center of the Y axis direction on wafer $W_1$, exposure center P moves between areas $B_1$ and $B_4$ or areas $B_2$ and $B_3$, via area $B_0$. Switching of the head (the third to the eleventh switching) occurs herein. When exposure center P moves between areas $B_1$ and $B_4$ via area $B_0$, the head to be used is switched between heads $60_4$, $60_1$, and $60_2$ and heads $60_3$, $60_4$, and $60_1$, and when exposure center P moves between areas $B_2$ and $B_3$, the head to be used is switched between heads $60_1$, $60_2$, and $60_3$ and heads $60_2$, $60_3$, and $60_4$.

Figure 10D:
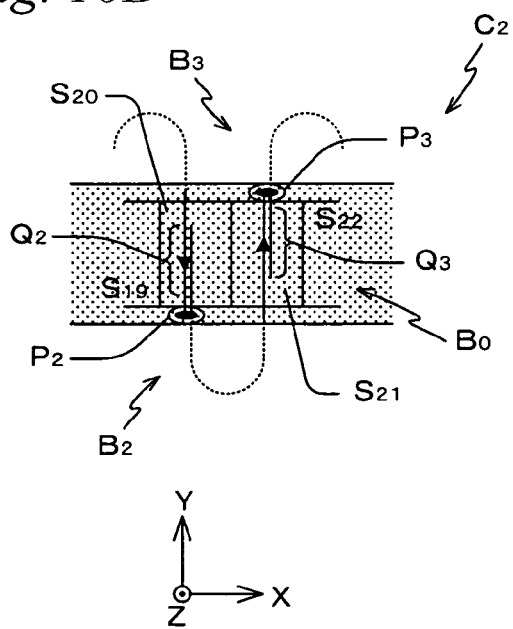

FIG. 10D shows an enlarged view of the inside of circle $C_2$ in FIG. 9, which is a view used to explain the details of the eighth and ninth switching, representing the third to the eleventh switching. As it can be seen from FIG. 10D, the $20^{th}$ shot area $S_{20}$ and the $21^{st}$ shot area $S_{21}$ (and other shot areas; the $15^{th}$ shot area $S_{15}$ to the $19^{th}$ shot area $S_{19}$, and the $22^{nd}$ shot area $S_{22}$) are located in area $B_0$. The track of exposure center P steps over area $B_0$, and spreads out to areas $B_2$ and $B_3$. In other words, exposure center F steps over area $B_0$, and moves back and forth areas $B_2$ and $B_3$.

After the $19_{th}$ shot area $S_{19}$ has been exposed, main controller 20 drives (controls the position of) wafer stage WST1 based on the measurement results of heads $60_2$, $60_3$, and $60_4$ (encoders $70_2$, $70_3$, and $70_4$), and performs a step movement of exposure center P toward the $20^{th}$ shot area $S_{20}$ along a path shown in a U-shape indicated by a broken line in FIG. 10D.

When exposure center P reaches acceleration starting position during the step movement, main controller 20 starts acceleration (synchronous drive) of wafer stage WST1 (wafer $W_1$) and reticle stage RST (reticle R). The velocity of both stages WST1 and RST becomes constant, after an acceleration time ($T_a$) has passed from the beginning of the acceleration.

Furthermore, during exposure time ($T_c$) after settling time ($T_b$), main controller 20 drives wafer stage WST1 in a constant manner, based on measurement results of heads $60_2$, $60_3$, and $60_4$ (encoders $70_2$, $70_3$, and $70_4$). This allows exposure center P to move in a constant velocity movement along a straight line path (scanning exposure path) indicated using a solid line in FIG. 10D. In other words, exposure area IA (exposure center P) moves in a constant velocity from the +Y edge to the −Y edge of shot area $S_{20}$, and scanning exposure of shot area $S_{20}$ is performed.

In parallel with the scanning exposure of shot area $S_{20}$ described above, or to be exact, in parallel with driving wafer stage WST1 in a constant manner for a part $Q_2$ of the scanning exposure path with respect to shot area $S_{20}$, main controller 20 performs the linkage computing previously described.

After scanning exposure of the 20$^{th}$ shot area S$_{20}$ has been performed, main controller 20 switches the heads to be used from heads 60$_2$, 60$_3$, and 60$_4$ to heads 60$_1$, 60$_2$, and 60$_3$ when wafer stage WST1 passes through a switching occurrence position P$_2$ on the −Y side of the 20th shot area S20 at a constant speed. Here, main controller 20 resets measurement value C$_1$ of head 60$_1$ which is to be newly used after the linkage process previously described, or in other words, after the switching, using coordinate offset O which is obtained by the linkage computing, so that the continuity of the measurement results of the position of wafer stage WST1 before and after the switching is secured.

After the switching, main controller 20 drives (controls the position of) wafer stage WST1 based on the measurement results of heads 60$_1$, 60$_2$, and 60$_3$ (encoders 70$_1$, 70$_2$, and 70$_3$), and performs a step movement toward the next shot area S$_{21}$. In this case, exposure center P draws a U-shaped track from the −Y edge of shot area S$_{20}$ and retreats to area B$_2$ once, and then returns to area B$_0$ and moves toward the next shot area S$_{20}$.

When exposure center P reaches acceleration starting position during the step movement, main controller 20 starts acceleration (synchronous drive) of wafer stage WST1 (wafer W$_1$) and reticle stage RST (reticle R).

Then, after acceleration time T$_a$ and settling time T$_b$ have passed from the beginning of the acceleration. main controller 20 drives wafer stage WST1 in a constant manner along the straight line path (scanning exposure path) indicated by a solid line in FIG. 10D, based on the measurement results of heads 60$_1$, 60$_2$, and 60$_3$ (encoders 70$_1$, 70$_2$, and 70$_3$). This allows exposure area IA (exposure center P) to move at a constant velocity from the −Y edge to the +Y edge of shot area S$_{21}$, and scanning exposure of shot area S$_{21}$ is performed.

In parallel with the scanning exposure of shot area S$_{21}$ described above, or to be exact, in parallel with driving wafer stage WST1 in a constant manner for a part Q$_3$ of the scanning exposure path with respect to shot area S$_{21}$, main controller 20 performs the linkage computing previously described. After scanning exposure of the 21$^{st}$ shot area S$_{21}$ has been performed, main controller 20 switches the heads to be used from heads 60$_1$, 60$_2$, and 60$_3$ to heads 60$_2$, 60$_3$, and 60$_4$ when wafer stage WST1 passes through a switching occurrence position P$_3$ on the +Y side of the 21$^{st}$ shot area S$_{21}$ at a constant speed. Here, main controller 20 resets measurement value C$_4$ of head 60$_4$ which is to be newly used after the linkage process previously described, or in other words, after the switching, using coordinate offset O which is obtained by the linkage computing, so that the continuity of the measurement results of the position of wafer stage WST1 before and after the switching is secured.

After the switching, main controller 20 drives (controls the position of) wafer stage WST1 based on the measurement results of heads 60$_2$, 60$_3$, and 60$_4$ (encoders 70$_2$, 70$_3$, and 70$_4$), and performs a step movement toward the next shot area S$_{22}$. In this case, exposure center P draws a U-shaped track from the +Y edge of shot area S$_{21}$ and retreats to area B$_3$ once, and then returns to area B$_0$ and moves toward the next shot area S$_{22}$.

Next, after exposure center P performs exposure processing on the 23$^{rd}$ shot area S$_{23}$ to the 26$^{th}$ shot area S$_{26}$ and has moved from area B$_3$ to area B$_0$, switching of the head (a twelfth switching) occurs when exposure processing of the 27$^{th}$ shot area S$_{27}$ within area B$_0$ is performed and exposure center P is stepped to the 28$^{th}$ shot area S$_{28}$ within area B$_4$. In this case, the heads to be used are switched from heads 60$_2$, 60$_3$, and 60$_4$ to heads 60$_3$, 60$_4$, and 60$_1$. The details are similar to the first switching previously described.

Similarly, after exposure center P performs exposure processing on the 31$^{st}$ shot area S$_{31}$ to the 33$^{rd}$ shot area S$_{33}$ and has moved from area B$_4$ to area B$_0$, switching of the head (a thirteenth switching) occurs when exposure processing of the 34$^{th}$ shot area S$_{34}$ within area B$_0$ is performed and exposure center P is stepped to the 35$^{th}$ shot area S$_{35}$ within area B$_3$. In this case, the heads to be used are switched from heads 60$_3$, 60$_4$, and 60$_1$ to heads 60$_2$, 60$_3$, and 60$_4$. The details in this case are also similar to the first switching previously described.

Due to the switching procedure and the linkage process described above, because switching of the heads do not occur during the scanning exposure of each shot area on the wafer in the exposure operation by the step-and-scan method, sufficient overlay accuracy is maintained, and a stable exposure processing of the wafer can be realized. Further, because the linkage computing is performed while wafer stage WST1 (WST2) moves at a constant speed during the scanning exposure, and the linkage process and the switching of the heads are performed using the results right after the scanning exposure, the continuity of the position measurement results of the wafer stage before and after the switching of the heads is secured.

Next, as a second example an exposure operation with respect to wafer W$_2$ shown in FIG. 13 will be described. In this case, on wafer W$_2$, a total of 38 shot areas S$_1$ to S$_{38}$, which are arranged in an odd number in the X-axis direction and an even number in the Y-axis direction, are to be arranged, as is shown enlarged in FIG. 14.

Figure 15:
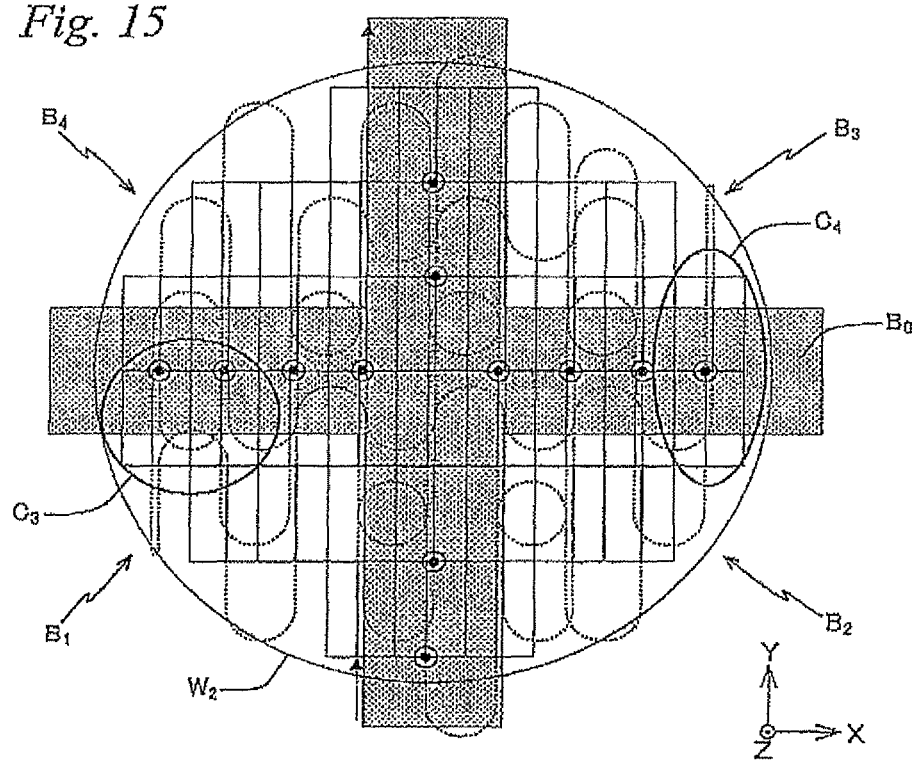
FIG. 15 is a view (No. 2) showing a movement track of the exposure center on a wafer in an exposure by a step-and-scan method.

An exposure by the step-and-scan method is performed with respect to wafer W2, along a path shown in FIG. 15. In FIG. 15, overlapping the path, areas B0 to B4 corresponding to the set of heads that face scale plate 21 when wafer stage WST1 is located at the position of exposure center P on the path and the occurrence place of the switching of the heads are shown. The notation in FIG. 15 is similar to the notation in FIG. 9.

First of all, after exposure center P performs exposure processing on the first shot area S$_1$ and has moved from area B$_1$ to area B$_0$, switching of the head (a first switching) occurs when exposure processing of the second shot area S$_2$ within area B$_0$ is performed and exposure center P is stepped to the third shot area S$_3$ within area B$_2$. Now, as is previously described, when exposure center P is located in areas B$_1$, B$_0$, and B$_2$, heads 60$_4$, 60$_1$, and 60$_2$, all of the heads 60$_1$ to 60$_4$, heads 60$_1$, 60$_2$, and 60$_3$ face scale plate 21, respectively. Accordingly, in the first switching, the heads to be used are switched from heads 60$_4$, 60$_1$, and 60$_2$ to heads 60$_1$, 60$_2$, and 60$_3$. The details are similar to the first switching with respect to wafer W$_1$ in the first example previously described.

Similar to the first switching described above, after exposure center P performs exposure processing on the fourth shot area S$_4$ to the sixth shot area S$_6$ and has moved from area B$_2$ to area B$_0$, switching of the head (a second switching) occurs when exposure processing of the seventh shot area S$_7$ within area B$_0$ is performed and exposure center P is stepped to the eighth shot area S$_8$ within area B$_1$. In this case, the heads to be used are switched from heads 60$_1$, 60$_2$, and 60$_3$ to heads 60$_4$, 60$_1$, and 60$_2$.

Next, when a step-and-scan exposure is performed of the 11$^{th}$ shot area S$_{11}$ to the 19$^{th}$ shot area S$_{19}$ lined in the X-axis direction in the center of the Y axis direction (the third row) on wafer W$_2$, exposure center P moves between areas B$_1$ and B$_4$ or areas B$_2$ and B$_3$, via area B$_0$. Switching of the head (the third to the tenth switching) occurs herein. Similarly, when a step-and-scan exposure is performed of the 20$^{th}$ shot area S$_{20}$ to the 28$^{th}$ shot area S$_{28}$ lined in the X-axis direction in the fourth row, exposure center P moves between areas B$_1$ and B$_4$ or areas $B_2$ and $B_3$, via area $B_0$. Switching of the head (the eleventh to the eighteenth switching) occurs herein. When exposure center P moves between areas $B_1$ and $B_4$ via area $B_0$, the head to be used is switched between heads $60_4$, $60_1$, and $60_2$ and heads $60_3$, $60_4$, and $60_1$, and when exposure center P moves between areas $B_2$ and $B_3$, the head to be used is switched between heads $60_1$, $60_2$, and $60_3$ and heads $60_2$, $60_3$ and $60_4$.

Figure 16A:
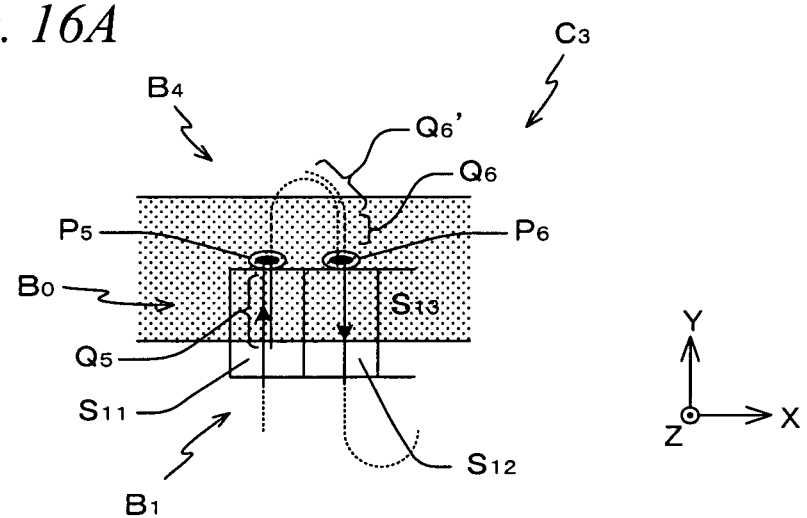
FIGS. 16A to 16C are views (No. 4 to 6) showing an example of a switching procedure of encoder heads.

FIG. 16A shows an enlarged view of the inside of circle $C_3$ in FIG. 15, which is a view used to explain the details of the third and fourth switching, representing the third to the eighteenth switching. As it can be seen from FIG. 16A, the eleventh shot area $S_{11}$ and the twelfth shot area $S1_2$ are located on the border of area $B_0$ and area $B_1$. The track of exposure center P steps over area $B_0$, and spreads out to areas $B_1$ and $B_4$. In other words, exposure center P steps over area $B_0$, and moves back and forth areas $B_1$ and $B_4$.

In this example, because the shot area subject to exposure is not completely included in area $B_0$, the detailed procedure of the third and the fourth switching differs to some extent from the detailed procedure of the eighth and the ninth switching of wafer $W_1$ previously described. Therefore, details of the third and the fourth switching will be described, placing an emphasis on the difference.

After the tenth shot area $S_{10}$ has been exposed, main controller 20 drives (controls the position of) wafer stage WST1 based on the measurement results of heads $60_4$, $60_1$, and $60_2$ (encoders $70_4$, $70_1$, and $70_2$), and performs a step movement of exposure center P toward the acceleration starting position for exposure of the eleventh shot area $S_{11}$ along a path indicated by a broken line in FIG. 15.

After the step movement, main controller 20 starts the acceleration synchronous drive of wafer stage WST1 (wafer W1) and reticle stage RST (reticle R). The velocity of both stages WST1 and RST becomes constant, after an acceleration time ($T_a$) has passed from the beginning of the acceleration.

Furthermore, during exposure time ($T_c$) After settling time ($T_b$), main controller 20 drives wafer stage WST1 in a constant manner, based on measurement results of heads $60_4$, $60_1$, and $60_2$ (encoders $70_4$, $70_1$, and $70_2$). This allows exposure center P to move in a constant velocity movement along a straight line path (scanning exposure path) indicated by a solid line in FIG. 16A. In other words, exposure area IA (exposure center P) moves at a constant velocity from the -Y edge to the +Y edge of shot area $S_{11}$, and scanning exposure of shot area $S_{11}$ is performed.

In parallel with the scanning exposure of shot area $S_{11}$ previously described, or to be exact, in parallel with driving wafer stage WST1 in a constant manner for a part $Q_5$ of the scanning exposure path with respect to shot area $S_{11}$, main controller 20 performs the linkage computing previously described, like the eighth and ninth switching with respect to wafer $W_1$ previously described. After scanning exposure of the eleventh shot area $S_{11}$ has been performed, main controller 20 switches the heads to be used from heads $60_4$, $60_1$, and $60_2$ to heads $60_3$, $60_4$, and $60_1$ (the third switching) when wafer stage WST1 passes through a switching occurrence position $P_5$ on the +Y side of the eleventh shot area $S_{11}$ at a constant speed. Here, main controller 20 resets measurement value $C_3$ of head $60_3$ which is to be newly used after the linkage process previously described, or in other words, after the switching, using coordinate offset O which is obtained by the linkage computing, so that the continuity of the measurement results of the position of wafer stage WST1 before and after the switching is secured.

After the switching, main controller 20 drives (controls the position of) wafer stage WST1 based on the measurement results of heads $60_3$, $60_4$, and $60_1$ (encoders $70_3$, $70_4$, and $70_1$), and performs a step movement toward the next shot area $S_{12}$. In this case, exposure center P draws a U-shaped track from the +Y edge of shot area $S_{11}$ and retreats to area $B_4$ once, and then returns to area $B_0$ and moves toward the next shot area $S_{12}$.

When exposure center P reaches acceleration starting position during the step movement, main controller 20 starts acceleration (synchronous drive) of wafer stage WST1 (wafer W1) and reticle stage RST (reticle R) to perform exposure processing on shot area $S_{12}$. However, because shot area $S_{12}$ is located on the border of area $B_0$ and area $B_1$, the heads need to be switched during the scanning exposure of the twelfth shot area $S_{12}$. Therefore, in the fourth switching, the heads to be used are switched from heads $60_3$, $60_4$, and $60_1$ to heads $60_4$, $60_1$, and $60_2$ before scanning exposure of the twelfth shot area $S_{12}$ is performed.

In the fourth switching, while exposure center P performs a step movement from shot area $S_{11}$ to shot area $S_{12}$ along a U-shaped path prior to the switching, main controller 20 performs the linkage computing previously described concurrently with driving wafer stage WST1 in a constant manner for part of a short straight line section $Q_6$ which exposure center P passes during settling time $T_b$. Before scanning exposure of the twelfth shot area $S_{12}$, main controller 20 switches the heads to be used from heads $60_3$, $60_4$, and $60_1$ to heads $60_4$, $60_1$, and $60_2$ when wafer stage WST1 passes through a switching occurrence position $P_6$ on the +Y side of the twelfth shot area $S_{12}$ at a constant speed. Here, main controller 20 resets measurement value $C_2$ of head $60_2$ which, is to be newly used after the linkage process previously described, or in other words, after the switching, using coordinate offset O which is obtained by the linkage computing, so that the continuity of the measurement results of the position of wafer stage WST1 before and after the switching is secured.

After the switching, main controller 20 moves wafer stage WST1 in a constant velocity along a straight line path (scanning exposure path) indicated by a solid line in FIG. 16A, according to the measurement results of heads $60_4$, $60_1$, and $60_2$ (encoders $70_4$, $70_1$, and $70_2$). This allows exposure area IA (exposure center P) to move at a constant velocity from the +Y edge to the -Y edge of shot area $S_{12}$, and scanning exposure of shot area $S_{12}$ is performed.

However, because the distance (distance of straight line section $Q_6$) in which wafer stage WST1 is driven at a constant speed is short in the linkage computing during settlement time $T_b$, a coordinate offset O which is sufficiently stable may not be obtained.

In order to prevent such a situation from occurring, as a first method for securing enough time for linkage computing (to obtain a sufficiently stable coordinate offset O), performing the linkage computing previously described while wafer stage WST1 is accelerated can be considered, or in other words, performing the linkage computing during the step, movement of exposure center P toward shot area $S_{12}$ along a U-shaped path in FIG. 16A, concurrently with driving wafer stage WST1 for a long curve section $Q_5'$ which is passed during acceleration time Ta (or a deceleration overscan time $T_e$ and acceleration time $T_a$). However, at this point, because wafer stage WST1 is accelerated, an error may occur on stage position measurement by encoder system 70.

Figure 17A:
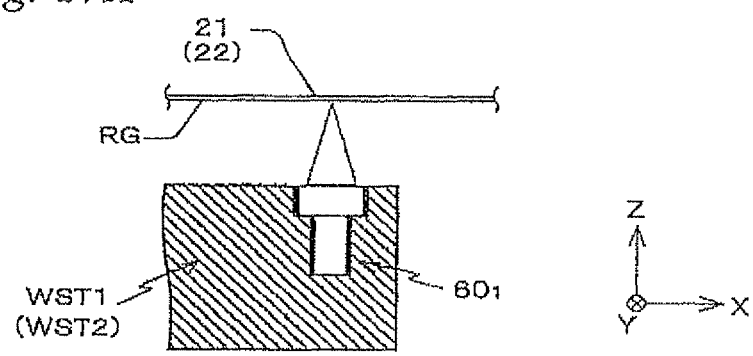
FIGS. 17A and 17B are views used to explain an occurrence principle of measurement errors in the encoder system involved with the acceleration of the wafer stage.
Figure 17B:
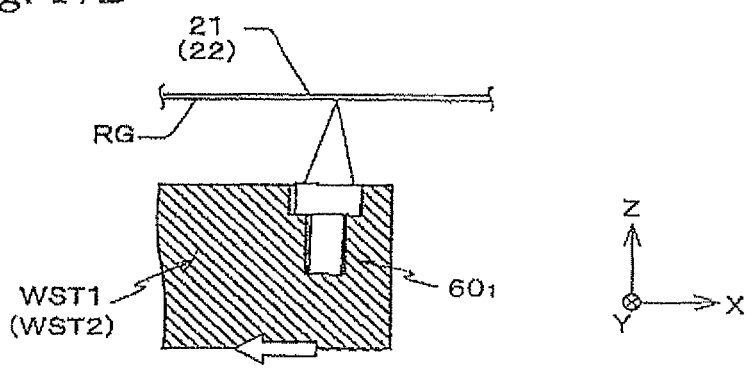

In other words, as shown in FIG. 17A, with encoder system 70 in the embodiment, a measurement beam is irradiated from head $60_1$ in parallel to the Z-axis, on scale plate 21 (22) facing head $60_1$ installed in wafer stage WST1. However, for example, when an acceleration in a direction (the −X direction) shown by an arrow in FIG. 17B is applied to wafer stage WST1, the setting position of encoder head $60_1$ shifts relatively to the +X direction with respect to wafer stage WST1, and the setting attitude is tilted to the θy direction. This makes the measurement beam tilt, which is irradiated on a point of scale plate 21 (22) shifted from the designed irradiation point, which in turn causes a measurement error.

Therefore, taking into consideration that there may be cases when linkage computing is performed during the acceleration time, a relation between the acceleration of wafer stage WST1 (WST2) and the measurement error of encoder system 70 (71) can be measured beforehand, and during operation of the exposure apparatus, the measurement results of encoder system 70 (71) can be corrected using the actual measurement data. Or, a measuring instrument which measures the position and tilt of heads $60_1$ to $60_4$ can be provided in wafer stage WST1 (WST2), and the measurement values of heads $60_1$ to $60_4$ can be corrected, based on measurement results of the measuring instrument.

Figure 16B:
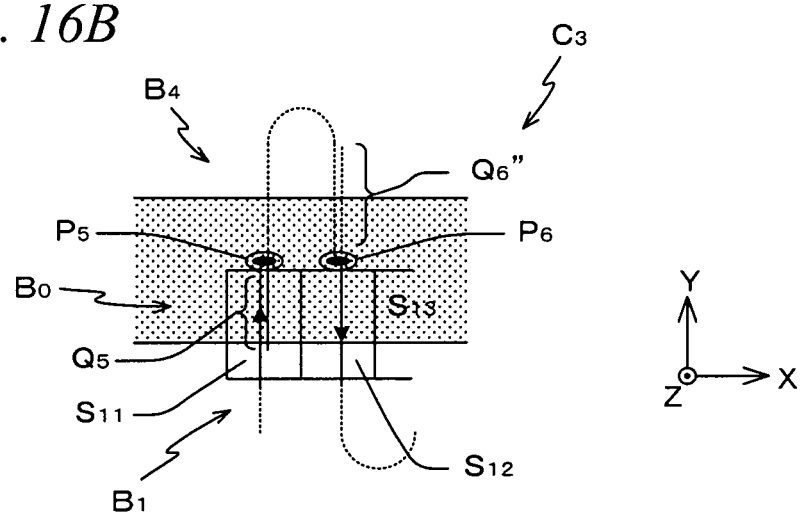

As a second method for securing enough time for linkage computing, as shown in FIG. 16B, a redundant section $Q_6''$ can be provided in the stepping path so as to extend the section where wafer stage WST1 moves at a constant speed (in other words, section $Q_6$ in FIG. 16A), and the linkage computing can be performed while wafer stage WST1 is driven at a constant speed in the section.

As a third method for securing enough time for linkage computing, to condition ($B \geq b_i + L + 2t$) for the configuration and placement of encoder heads $60_1$ to $60_4$ and scale plate 21 previously described, a condition $B \geq b_i + 2La + 2t$ can be considered to be added (in other words, change to condition $B \geq b_i + \text{Max}(L, 2La) + 2t$, further taking into consideration distance La in the Y-axis direction in the U-shaped stepping section.

Figure 16C:
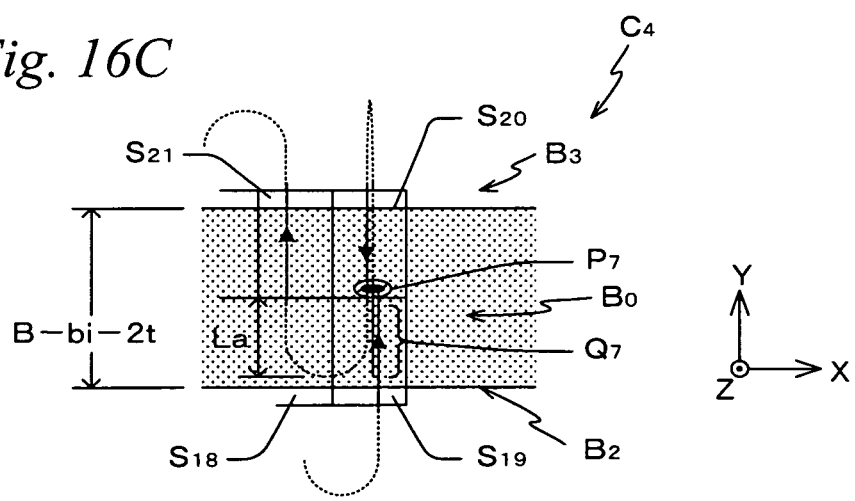

FIG. 16C shows an enlarged view of the inside of circle C4 in FIG. 15. However, in FIG. 16C, according to condition $B \geq b_i + \text{Max}(L, 2La) + 2t$ described above, area $B_0$ expands in the Y-axis direction. In the case of FIG. 16C, because the U-shaped stepping section is completely included in area $B_0$, after shot area $S_{19}$ has been exposed, the heads need to be switched (the tenth switching in FIG. 15) only when the wafer steps in the Y direction toward shot area $S_{20}$, and the third to ninth switching and the eleventh to eighteenth switching no longer are necessary.

Incidentally, condition $B \geq b_i + \text{Max}(L, 2La) + 2t$ can be applied not only to a shot arrangement where an even number of shot areas are arranged in the Y-axis direction like in wafer $W_2$, and can also be applied to an arbitrary shot arrangement.

Next, after exposure center P performs exposure processing on the $29^{th}$ shot area $S_{29}$ to the $31^{st}$ shot area $S_{32}$ and has moved from area $B_4$ to area $B_0$, switching of the head (a nineteenth switching) occurs when exposure processing of the $32^{nd}$ shot area $S_{32}$ within area $B_0$ is performed and exposure center P is stepped to the $33^{rd}$ shot area $S_{33}$ within area $B_3$. In this case, the heads to be used are switched from heads $60_3$, $60_4$, and $60_1$ to heads $60_2$, $60_3$, and $60_4$. The details are similar to the first switching previously described.

Similarly, after exposure center P performs exposure processing on the $36^{th}$ shot area $S_{36}$ and has moved from area $B_3$ to area $B_0$, switching of the head (a twentieth switching) occurs when exposure processing of the $37^{th}$ a shot area $S_{37}$ within area $B_0$ is performed and exposure center P is stepped to the $38^{th}$ shot area $S_{38}$ within area $B_4$. In this case, the heads to be used are switched from heads $60_2$, $60_3$, and $60_4$ to heads $60_3$, $60_4$, and $60_1$. The details in this case are also similar to the first switching previously described.

Due to the switching procedure and the linkage process described above, because switching of the heads do not occur during the scanning exposure of each shot area on the wafer in the exposure operation by the step-and-scan method, sufficient overlay accuracy is maintained, and a stable exposure processing of the wafer can be realized. Further, during the scanning exposure, main controller 20 performs the linkage computing while wafer stage WST1 (WST2) moves at a constant speed, and then performs the linkage process and exchange of the heads using the results immediately after the scanning exposure. Or, main controller 20 performs linkage computing while wafer stage WST1 (WST2) moves at a constant speed during the stepping movement, or performs linkage computing while correcting the acceleration during the acceleration movement, and using the measurement results, performs the linkage process and switching of the heads just before the scanning exposure. This allows the continuity of the position coordinate of the wafer stage computed before and after the switching to be secured.

Next, the principle of position measurement in directions of three degrees of freedom (Z, θx, θy) by encoder systems 70 and 71 will be further described. Here, measurement results or measurement values of encoder heads $60_1$ to $60_4$ or encoders $70_1$ to $70_4$ refer to measurement results of encoder heads $60_1$ to $60_4$ or encoders $70_1$ to $70_4$ in the Z-axis direction.

In the embodiment, by employing a configuration and an arrangement of encoder heads $60_1$ to $60_4$ and scale plate 21 as is previously described, at least three of the encoders head $60_1$ to $60_4$ face (corresponding sections $21_1$ to $21_4$ of) scale plate 21 according to area $A_0$ to $A_4$ where wafer stage WST1 (WST2) is located within the exposure time movement area. Effective measurement values are sent to main controller 20 from the heads (encoders) facing scale plate 21.

Main controller 20 computes the position (Z, θx, θy) of wafer stage WST1 (WST2), based on measurement results of encoders $70_1$ to $70_4$. Here, the measurement values (each expressed as $D_1$ to $D_4$, respectively, to distinguish the values from measurement values $C_1$ to $C_4$ in a measurement direction which is not in the Z-axis direction as is previously described, namely, in a uniaxial direction in the XY plane) of encoders $70_1$ to $70_4$ in the Z-axis direction depend upon the position (Z, θx, θy) of wafer stage WST1 (WST2) as in formulas (5) to (8) below.

$$D_1 = -p \tan \theta y + p \tan \theta x + Z \qquad (5)$$

$$D_2 = -p \tan \theta y + p \tan \theta x + Z \qquad (6)$$

$$D_3 = -p \tan \theta y + p \tan \theta x + Z \qquad (7)$$

$$D_4 = -p \tan \theta y + p \tan \theta x + Z \qquad (8)$$

However, p is the distance (refer to FIG. 5) of the head in the X-axis and the Y-axis directions from the center of wafer table WTB1 (WTB2).

Main controller 20 selects the formulas that the measurement values of the three heads (encoders) follow according to areas $A_0$ to $A_4$ where wafer stage WST1 (WST2) is positioned from formula (5) to (8) described above, and by substituting and solving the measurement values of the three heads (encoders) into the simultaneous equation built from the three formulas which were selected, the position (Z, θx, θy) of wafer stage WST1 (WST2) is computed. For example, when wafer stage WST1 (or WST2) is located in the first area $A_1$, main controller 20 forms a simultaneous equation from formulas (5), (6) and (8) that measurement values of heads $60_1$, $60_2$, and $60_4$ (encoders $70_1$, $70_2$, and $70_4$) follow, and solves the simultaneous equation by substituting the measurement values into the left side of formulas (5), (6) and (8), respectively.

Incidentally, in the case wafer stage WST1 (WST2) is located in the 0th area $A_0$, three heads from heads $60_1$ to $60_4$ (encoders $70_1$ to $70_4$) can be randomly selected, and a simultaneous equation made from the formulas that the measurement values of the selected three heads follow can be used.

Based on the computation results (Z, θx, θy) above and step information (focus mapping data) previously described, main controller 20 performs a focus leveling control on wafer stage WST1 (WST2) within the exposure time movement area.

In the case wafer stage WST1 (or WST2) is located within measurement time movement area, main controller 20 measures the positional information in directions of three degrees of freedom (Z, θx, θy), using encoder system 70 or 71. The measurement principle and the like, here, is the same as in the case when wafer stage WST1 is located within the exposure time movement area previously described, except for the point where the exposure center is replaced with the detection center of alignment system ALG, and (sections $21_1$ to $21_4$ of) scale plate 21 is replaced with (sections $22_1$ to $22_4$ of) scale plate 22. Based on the measurement results of encoder system 70 or 71, main controller 20 performs a focus leveling control on wafer stage WST1 (WST2). Incidentally, in the measurement time movement area (measurement station), focus leveling does not necessarily have to be performed. In other words, a mark position and the step information (focus mapping data) should be obtained in advance, and by deducting the z tilt of the wafer stage at the time of obtaining the step information from the step information, the step information of the reference surface of the wafer stage, such as the step information with the upper surface serving as the reference surface, should be obtained. And, at the time of exposure, focus leveling becomes possible based on the positional information in directions of three degrees of freedom (Z, θx, θy) of this step information and (the reference surface of) the wafer surface.

Furthermore, main controller 20 switches and uses three heads that include at least one different head out of heads $60_1$ to $60_4$ that face scale plates 21 and 22, according to the position of wafer stages WST1 and WST2. In this case, when an encoder head is switched, the linkage process similar to the one previously described is performed to secure the continuity of the measurement results of the position of wafer stage WST1 (or WST2).

As discussed in detail above, in exposure apparatus 100 of the embodiment, encoder systems 70 and 71 are provided which measure the positional information of wafer stages WST1 and WST2 in directions of six degrees of freedom (X, Y, Z, θx, θy, and θz) by irradiating measurement beams from the four heads $60_1$ to $60_4$ installed in wafer stages WST1 and WST2 on scale plate 21 that covers the movable range of wafer stages WST1 and WST2 except for the area right below projection optical system PL (alignment system ALG). And, placement distances A and B of heads $60_1$ to $60_4$ are each set to be larger than width $a_i$ and $b_i$ of the opening of scale plates 21 and 22, respectively. This allows the positional information of wafer stages WST1 and WST2 to be obtained (measured), by switching and using the three heads facing scale plates 21 and 22 out of the four heads $60_1$ to $60_4$ according to the position of wafer stages WST1 and WST2.

Furthermore, with exposure apparatus 100 of the embodiment, placement distances A and B of heads $60_1$ to $60_4$ are each set larger than the sum of width $a_i$ and $b_i$ of the opening of scale plates 21 and 22 and width W and L of the shot area. This allows the positional information of wafer stages WST1 and WST2 to be obtained without the heads $60_1$ to $60_4$ being switched, while wafer stages WST1 and WST2 which hold a wafer for exposure of the wafer is scanned (in constant velocity) and driven. Accordingly, the pattern can be formed on the wafer with good accuracy, and especially for exposure from the second layer onward, the overlay accuracy can be maintained with high precision.

Further, in exposure apparatus 100 of the embodiment, by using the measurement results of the positional information of wafer stages WST1 and WST2 measured by the four heads $60_1$ to $60_4$, wafer stages WST1 and WST2 holding the wafer are scanned (in constant velocity) and driven to expose the shot areas subject to exposure on the wafer, and after the drive, three heads which make a set used for measuring the positional information from the four heads $60_1$ to $60_4$ are switched to another set (including at least one different head), according to the position of wafer stages WST1 and WST2. Or, by using the measurement results of the positional information, wafer stages WST1 and WST2 are driven and stepped to a starting point of scanning (in constant velocity) for the shot areas subject to exposure, and after the stepping movement, before wafer stages WST1 and WST2 are scanned (in constant velocity) and driven to expose the shot areas subject to exposure, the heads which make a set used for measuring the positional information from the four heads $60_1$ to $60_4$ are switched to another set (including a different head). This allows the positional information of wafer stages, WST1 and WST2 to be obtained without the heads $60_1$ to $60_4$ being switched, while wafer stages WST1 and WST2 which hold a wafer for exposure of the wafer is scanned (in constant velocity) and driven. Accordingly, the pattern can be formed on the wafer with good accuracy, and especially for exposure from the second layer onward, the overlay accuracy can be maintained with high precision.

Incidentally, in the embodiment above, at least one auxiliary head can be provided in the vicinity of each of the heads on the four corners of the upper surface of the wafer table, and in the case a measurement abnormality occurs in the main heads, the measurement can be continued by switching to the auxiliary head nearby.

Incidentally, in the embodiment above, while the case where two-dimensional diffraction grating RG was formed on the lower surface of sections $21_1$ to $21_4$ of scale plate 21 and sections $22_1$ to $22_4$ of scale plate 22 was described as an example, besides this, the embodiment described above can also be applied in the case where a one-dimensional diffraction grating whose periodic direction is only in the measurement direction (in a uniaxial direction within the XY plane) of the corresponding encoder heads $60_1$ to $60_4$ is formed.

Further, in the embodiment above, as each of the heads $60_1$ to $60_4$ (encoders $70_1$ to $70_4$), while the case has been described where a two-dimensional encoder whose measurement direction is in a uniaxial direction within the XY plane and in the Z-axis direction was employed as an example, besides this, a one-dimensional encoder whose measurement direction is in a uniaxial direction within the XY plane and a one-dimensional encoder (or a surface position sensor and the like of a non-encoder method) whose measurement direction is in the Z-axis direction can also be employed. Or, a two-dimensional encoder whose measurement direction is in two axial directions which are orthogonal to each other in the XY plane can be employed. Furthermore, a three-dimensional encoder (3 DOF sensor) whose measurement direction is in the X-axis, the Y-axis, and the Z-axis direction can also be employed.

Incidentally, in the embodiment described above, while the case has been described where the exposure apparatus is a scanning stepper, the present invention is not limited to this, and the embodiment described above can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage by an interferometer, and it becomes possible to position the stage with high precision based on the measurement values of the encoder, which in turn makes it possible to transfer a reticle pattern on the wafer with high precision. Further, the embodiment described above can also be applied to a projection exposure apparatus by a step-and-stitch method that synthesizes a shot area and a shot area. Moreover, the embodiment described above can also be applied to a multi-stage type exposure apparatus equipped with a plurality of wafer stages, as is disclosed in, for example, U.S. Pat. Nos. 6,590,634, 5,969,441, and No. 6,208,407 and the like. Further, the embodiment described above can also be applied to an exposure apparatus which is equipped with a measurement stage including a measurement member (for example, a reference mark, and/or a sensor and the like) separate from the wafer stage, as disclosed in, for example, U.S. Patent Application publication No. 2007/0211235, and U.S. Patent Application Publication No. 2007/0127006 and the like.

Further, the exposure apparatus in the embodiment above can be of a liquid immersion type, like the ones disclosed in, for example, PCT International Publication No. 99/49504, U.S. Patent Application Publication No. 2005/0259234 and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like), on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as the embodiment above can be obtained by measuring the position of the stage using an encoder.

Further, as is disclosed in, for example, PCT International Publication No. 2001/035168, the embodiment above can also be applied to an exposure apparatus (lithography system) that forms line-and-space patterns on a wafer W by forming interference fringes on wafer W.

Moreover, as disclosed in, for example, U.S. Pat. No. 6,611,316, the embodiment above can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. Further, the embodiment described above can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the disclosures of all publications, the Published PCT International Publications, the U.S. patent applications and the U.S. patents that are cited in the description so far related to exposure apparatuses and the like are each incorporated herein by reference.

Incidentally, electronic devices such as a semiconductor are manufactured through the steps of; a step where the function/performance design of the device is performed, a step where a reticle based on the design step is manufactured, a step where a wafer is manufactured from silicon materials, a lithography step where the pattern formed on a mask is transferred onto an object such as the wafer by the exposure apparatus in the embodiment above, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, because the exposure apparatus and the exposure method in the embodiment above is used in the lithography step, devices having high integration can be produced with good yield.

Further, the exposure apparatus (pattern formation apparatus) of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus which sequentially exposes an energy beam on a plurality of divided areas placed on an object, and forms a pattern on each of the plurality of divided areas, the apparatus comprising:
    a movable body which holds the object and moves along a predetermined plane;
    a position measurement system which has a plurality of heads provided on the movable body, and obtains positional information of the movable body based on measurement results of a predetermined number of heads of the plurality of heads, the predetermined number of heads irradiating a measurement beam on a measurement plane placed facing the movable body roughly in parallel to the predetermined plane and having a measurement non-effective area in part of the measurement plane, receiving a return beam from the measurement plane, and measuring a position of the movable body in each measurement direction; and
    a control system which drives the movable body, while switching a head to be used to compute the positional information of the movable body, based on the positional information obtained by the position measurement system, wherein
    of the plurality of heads, a separation distance of two heads set apart in a predetermined direction within the predetermined plane is decided, taking into consideration a size of the measurement non-effective area in the predetermined direction.

2. The exposure apparatus according to claim 1 wherein the separation distance of the two heads set apart in the predetermined direction is larger than the size of the measurement non-effective area in the predetermined direction.

3. The exposure apparatus according to claim 2 wherein the separation distance of the two heads set apart in the predetermined direction is larger than a sum of the size in the predetermined direction of the measurement non-effective area and each of the plurality of divided areas.

4. The exposure apparatus according to claim 1, the apparatus further comprising:
    an optical system which emits the energy beam to the object.

5. A making method of an exposure apparatus which sequentially exposes an energy beam on a plurality of divided areas placed on an object, and forms a pattern on each of the plurality of divided areas, the method comprising:
    providing a movable body which holds the object and moves along a predetermined plane;
    providing a position measurement system which has a plurality of heads provided on the movable body, and obtains positional information of the movable body based on measurement results of a predetermined number of heads of the plurality of heads, the predetermined number of heads irradiating a measurement beam on a measurement plane placed facing the movable body roughly in parallel to the predetermined plane and having a measurement non-effective area in part of the measurement plane receiving a return beam from the measurement plane, and measuring a position of the movable body in each measurement direction; and
    providing a control system which drives the movable body, while switching a head to be used to compute the positional information of the movable body, based on the positional information obtained by the position measurement system, wherein
    of the plurality of heads, a separation distance of two heads set apart in a predetermined direction within the predetermined plane is decided, taking into consideration a size of the measurement non-effective area in the predetermined direction.

6. The method according to claim 5 wherein the separation distance of the two heads set apart in the predetermined direction is larger than the size of the measurement non-effective area in the predetermined direction.

7. The method according to claim 6 wherein the separation distance of the two heads set apart in the predetermined direction is larger than a sum of the size in the predetermined direction of the measurement non-effective area and each of the plurality of divided areas.

* * * * *